US006832360B2

(12) United States Patent
Li

(10) Patent No.: US 6,832,360 B2
(45) Date of Patent: Dec. 14, 2004

(54) PURE FILL VIA AREA EXTRACTION IN A MULTI-WIDE OBJECT CLASS DESIGN LAYOUT

(75) Inventor: Mu-Jing Li, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 26 days.

(21) Appl. No.: 10/260,816

(22) Filed: Sep. 30, 2002

(65) Prior Publication Data

US 2004/0064797 A1 Apr. 1, 2004

(51) Int. Cl.$^7$ .................................................. G06F 9/45
(52) U.S. Cl. ............................. 716/5; 716/2; 716/10; 716/11
(58) Field of Search .......................... 716/2, 5, 10, 11

(56) References Cited

U.S. PATENT DOCUMENTS

| | | | |
|---|---|---|---|
| 5,620,916 A | | 4/1997 | Eden et al. |
| 5,689,435 A | | 11/1997 | Umney et al. |
| 5,706,295 A | | 1/1998 | Suzuki |
| 5,798,937 A | | 8/1998 | Bracha et al. |
| 5,926,723 A | | 7/1999 | Wang |
| 5,970,238 A | | 10/1999 | Shibata et al. |
| 6,011,911 A | | 1/2000 | Ho et al. |
| 6,026,224 A | | 2/2000 | Darden et al. |
| 6,063,132 A | | 5/2000 | DeCamp et al. |
| 6,078,737 A | | 6/2000 | Suzuki |
| 6,189,136 B1 | | 2/2001 | Bothra |
| 6,209,123 B1 | * | 3/2001 | Maziasz et al. ................ 716/14 |
| 6,275,971 B1 | | 8/2001 | Levy et al. |
| 6,324,673 B1 | | 11/2001 | Luo et al. |
| 6,370,679 B1 | | 4/2002 | Chang et al. |
| 6,374,395 B1 | | 4/2002 | Wang |
| 6,378,110 B1 | | 4/2002 | Ho |
| 6,446,873 B1 | * | 9/2002 | Geryk .......................... 235/487 |
| 6,457,163 B1 | | 9/2002 | Yang |
| 6,461,877 B1 | * | 10/2002 | Holloway et al. .............. 438/8 |
| 6,484,302 B1 | | 11/2002 | Freymuth |
| 6,487,706 B1 | | 11/2002 | Barkley et al. |
| 6,536,023 B1 | | 3/2003 | Mohan et al. |
| 6,606,735 B1 | | 8/2003 | Richardson et al. |
| 6,611,946 B1 | | 8/2003 | Richardson et al. |
| 6,615,400 B1 | | 9/2003 | Lukanc |
| 6,637,013 B1 | | 10/2003 | Li |
| 6,718,527 B2 | | 4/2004 | Li |
| 2002/0127479 A1 | | 9/2002 | Pierrat |
| 2002/0174413 A1 | | 11/2002 | Tanaka |
| 2003/0061583 A1 | | 3/2003 | Malhotra |

(List continued on next page.)

OTHER PUBLICATIONS

Yu Chen et al., "Hierarchical Dummy Fill for Process Uniformity," Proc. Asia and South Pacific Design Automation Conf, Jan. 2001, pp. 139–144.

(List continued on next page.)

Primary Examiner—Vuthe Siek
(74) Attorney, Agent, or Firm—Zagorin, O'Brien & Graham, LLP

(57) ABSTRACT

In a multi-wide object class design layout, an automatic extraction of pure fill via areas (PFVA) among multi wide class objects treats the virtual boundaries of the wide objects differently than non-virtual boundaries to allow an extracted pure fill via area to extend across a virtual edge of a wide class object. An exemplary method is provided for deriving one or more pure fill via areas for geometries on a first layer in a design layout having multi-wide object classes on the first layer. The exemplary method includes forming a Current PFVA, initially as a PFVA for the geometries of the layer, and successively adjusting the Current PFVA for each higher wide object class corresponding to the geometries, to accommodate the respective enclosure rules for each higher wide object class.

32 Claims, 15 Drawing Sheets

U.S. PATENT DOCUMENTS

| | | |
|---|---|---|
| 2003/0088843 A1 | 5/2003 | Mehrotra et al. |
| 2003/0182644 A1 | 9/2003 | Li et al. |
| 2003/0196180 A1 | 10/2003 | Li et al. |
| 2003/0229860 A1 | 12/2003 | Li |
| 2003/0229862 A1 | 12/2003 | Li et al. |
| 2004/0019862 A1 | 1/2004 | Li et al. |
| 2004/0019866 A1 | 1/2004 | Li |
| 2004/0019867 A1 | 1/2004 | Li |
| 2004/0019868 A1 | 1/2004 | Li |
| 2004/0025125 A1 | 2/2004 | Li |
| 2004/0063228 A1 | 4/2004 | Li et al. |
| 2004/0064795 A1 | 4/2004 | Li et al. |
| 2004/0064796 A1 | 4/2004 | Li |

OTHER PUBLICATIONS

Andrew B. Kahng et al., "Filling Algorithms and Analyses for Layout Density Control," IEEE Trans. Computer Aided Design 18(4) (1999) pp. 445–462.

Barnes, "Skill: A CAD System Extension Language," 1990 27$^{th}$ ACM/EEE Design Automation Conference, pp. 266–271.

Karam et al., "High Level CAD Melds Microsystems with Foundries," 1996 European Design and Test Conference, pp. 442–447.

Luo et al., "An Edge–Endpoint–Based Configurable Hardware Architecture for VLSI CAD Layout Design Rule Checking," 1999 7$^{th}$ Annual IEEE Symposium on Field–Programmable Custom Computing Machines, pp. 158–167.

Diva Verification, http://www.cadence.com/datasheets/diva.html 2002 Cadence Design Systems, Inc., downloaded May 17, 2002, 3 pages.

* cited by examiner

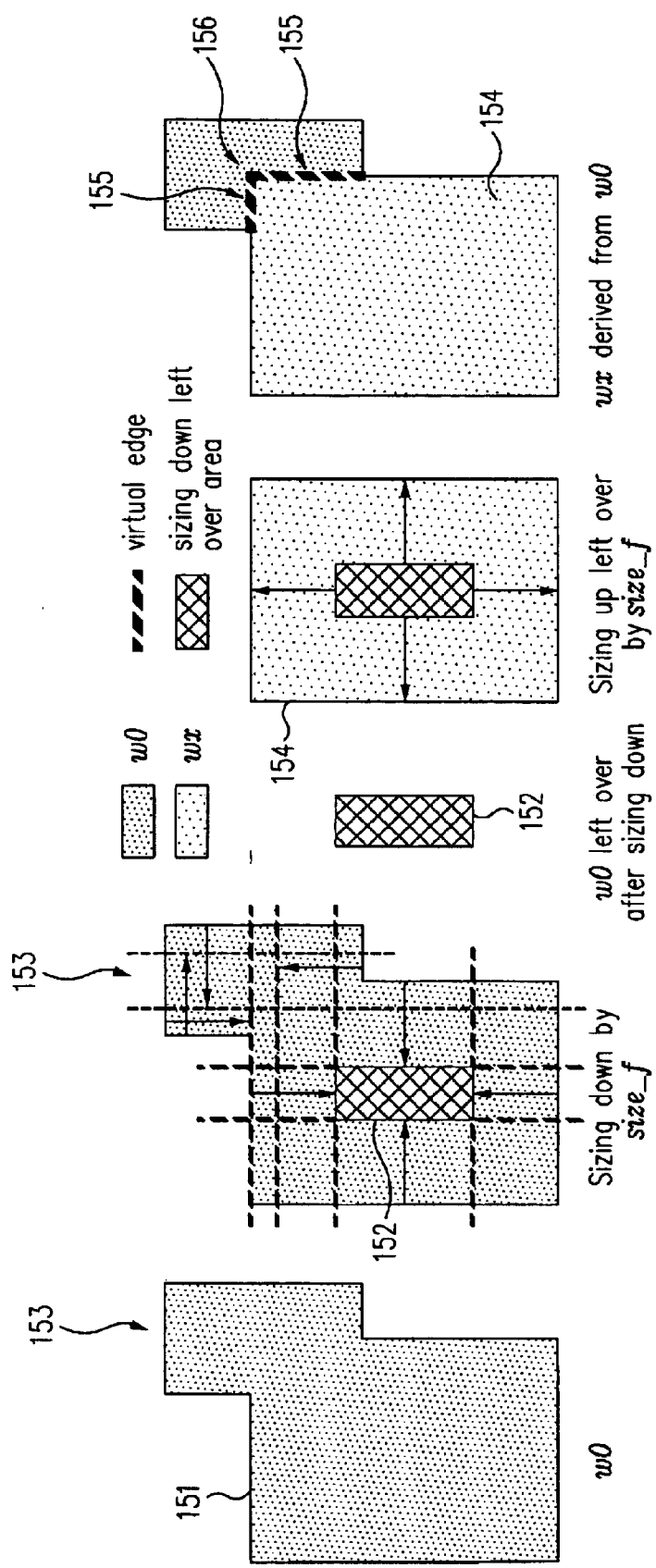

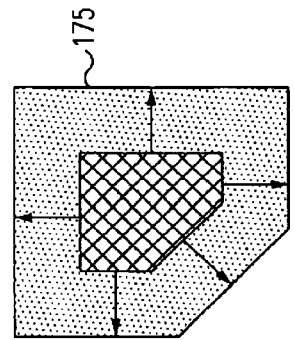
FIG. 4A
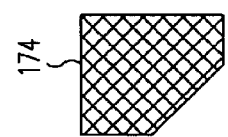
FIG. 4C
FIG. 4B
FIG. 4D
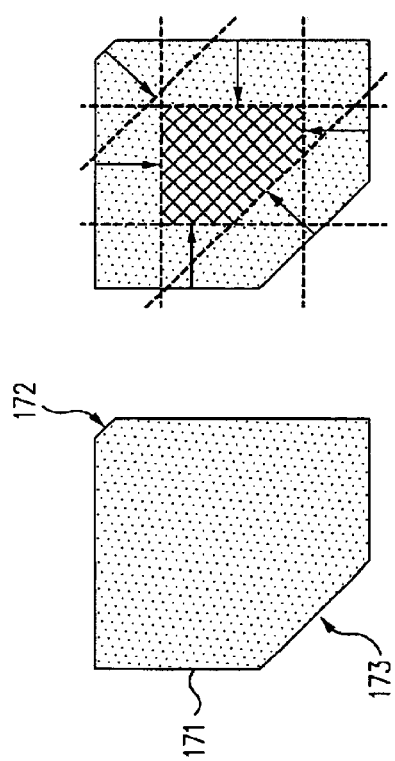
FIG. 4E
FIG. 4F
FIG. 4G
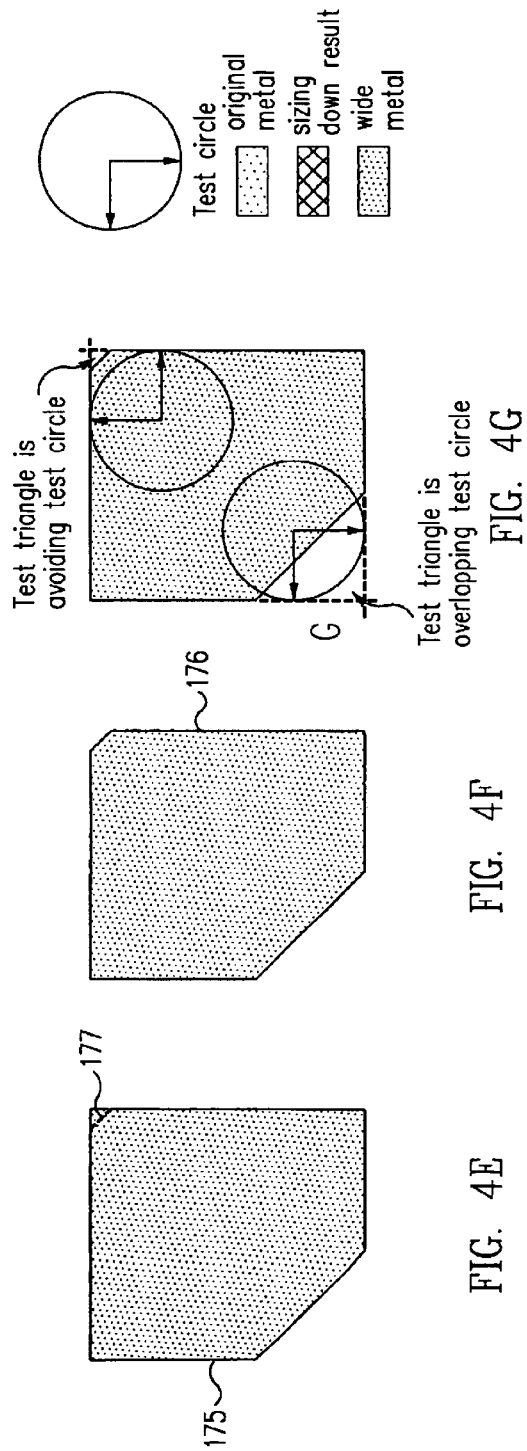

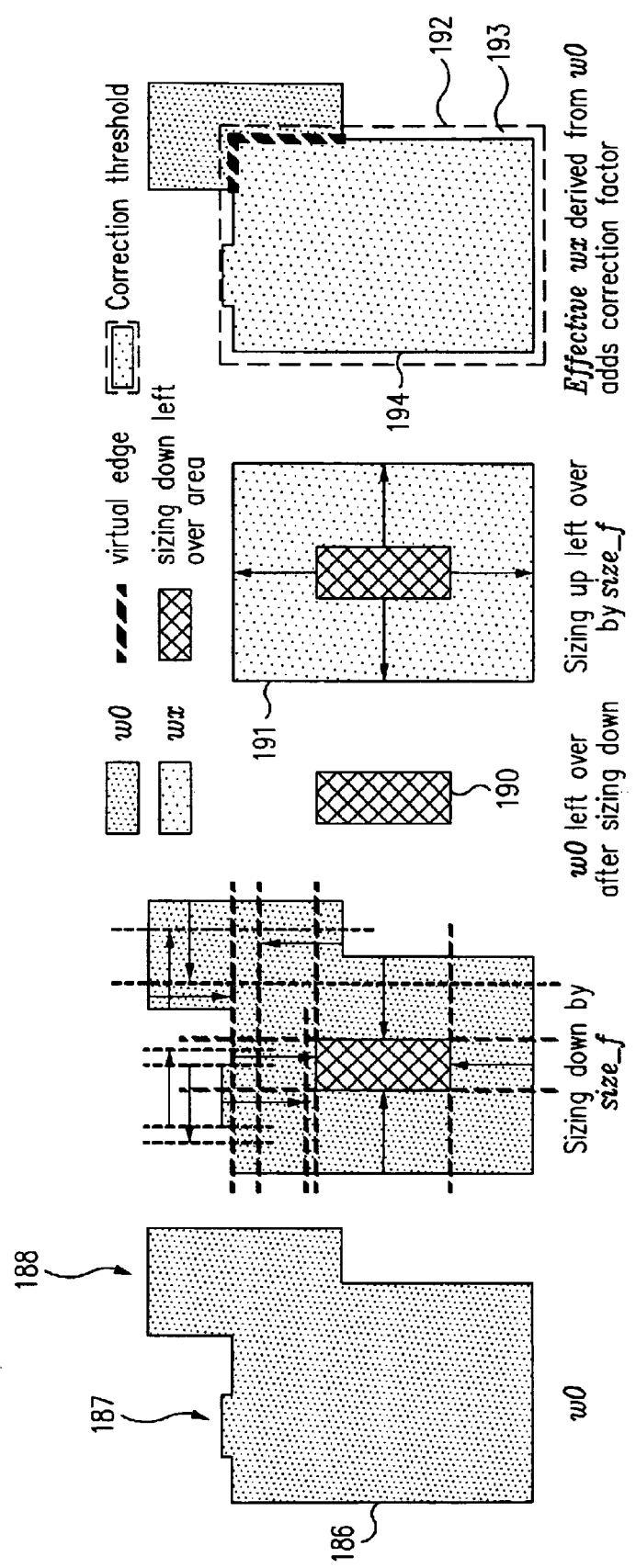

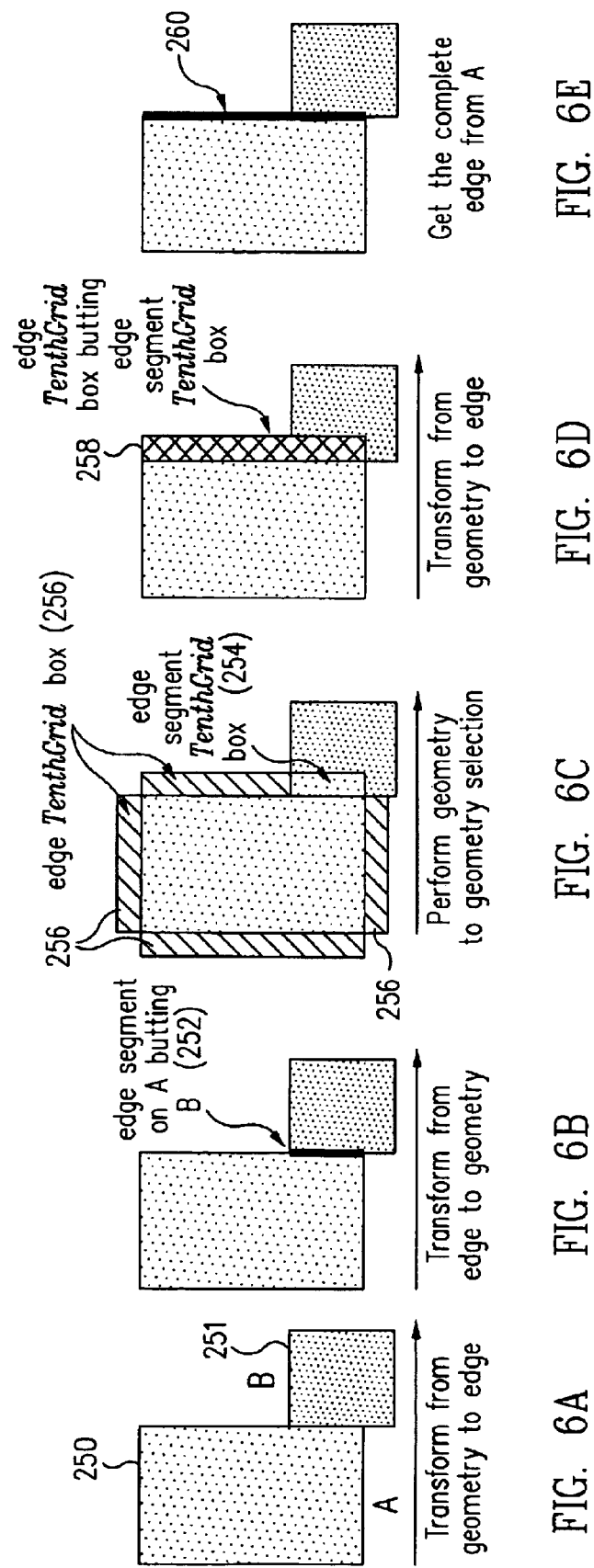

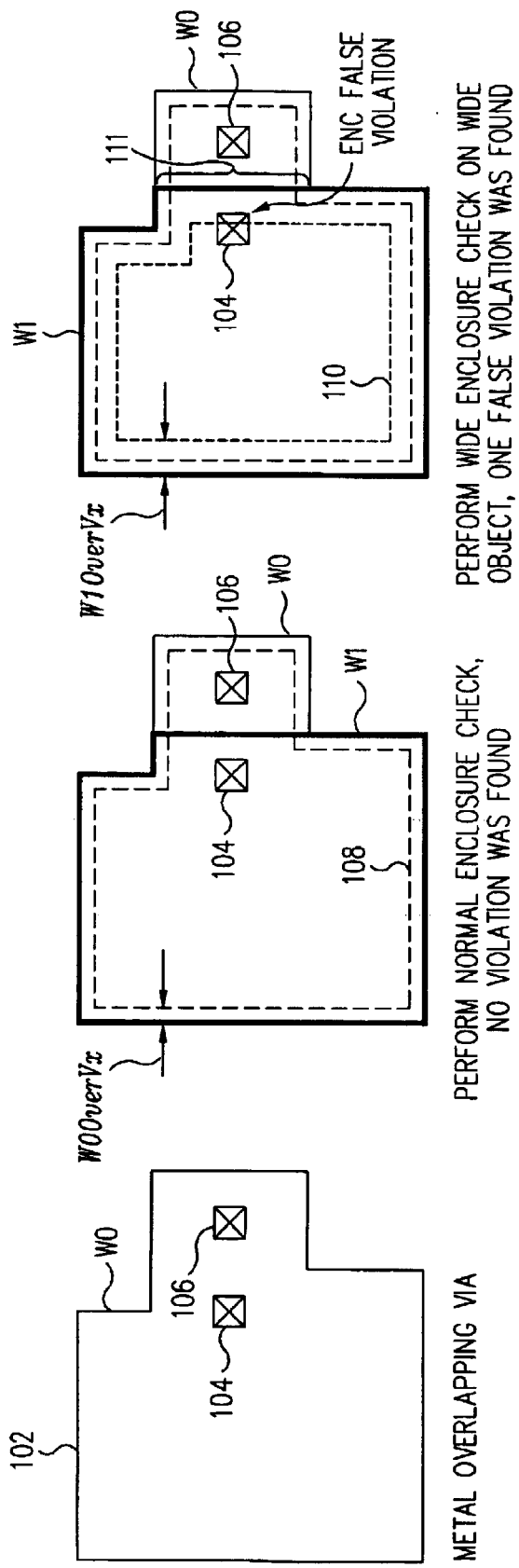
FIG. 9A  FIG. 9B  FIG. 9C
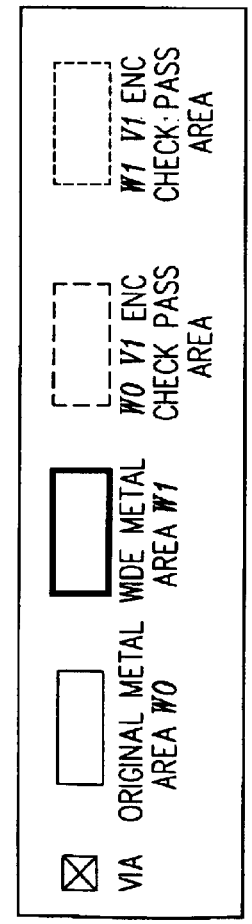

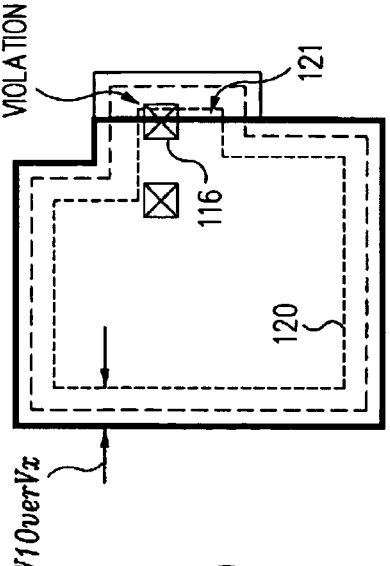
$W1overVi$
PERFORM WIDE ENCLOSURE CHECK ON $W0$ FOR THOSE VIAS WHICH ARE OVERLAPPING WITH $W1$ OBJECTS, ONE FALSE ERROR WAS FOUND, BECAUSE THE $W1$ RULE HAS BEEN APPLIED ON THE $W0$ AREA
FIG. 10C
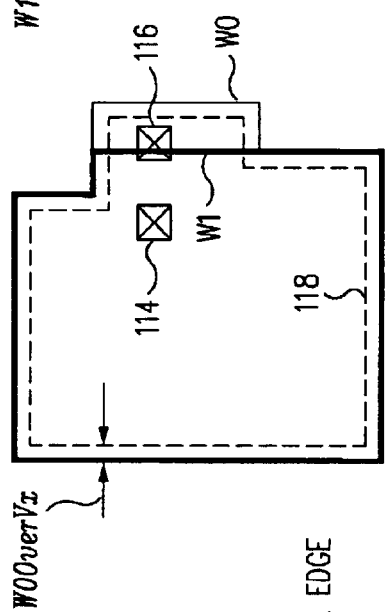
$W00verVi$
PERFORM NORMAL ENCLOSURE CHECK, NO VIOLATION WAS FOUND
FIG. 10B
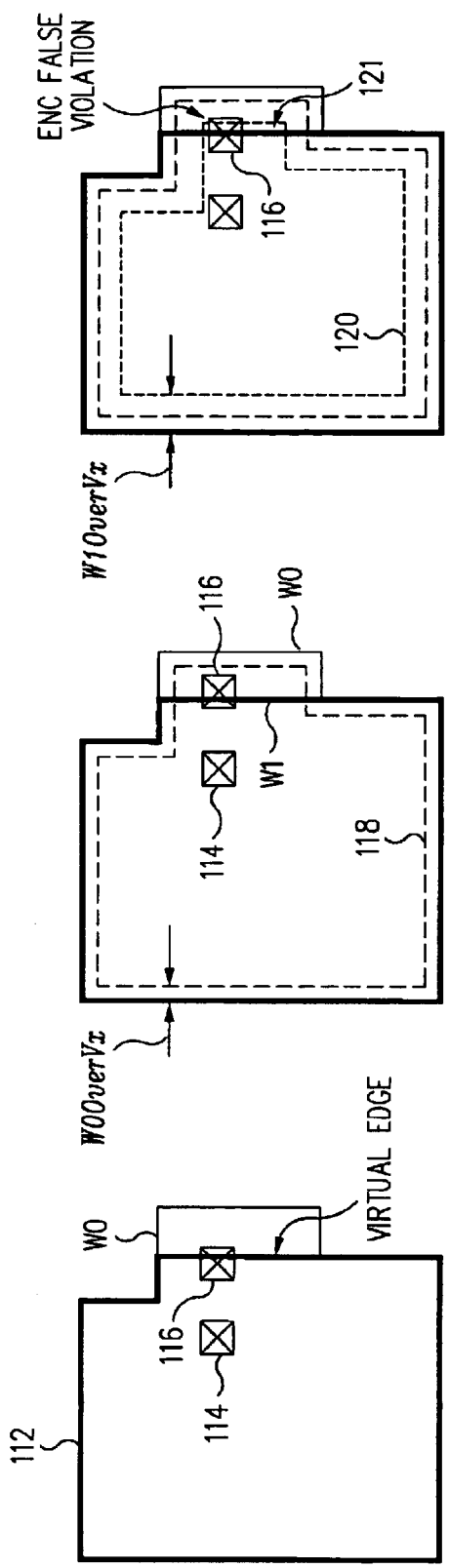
WIDE METAL HAS BEEN SEPARATED FROM ORIGINAL GEOMETRY
FIG. 10A
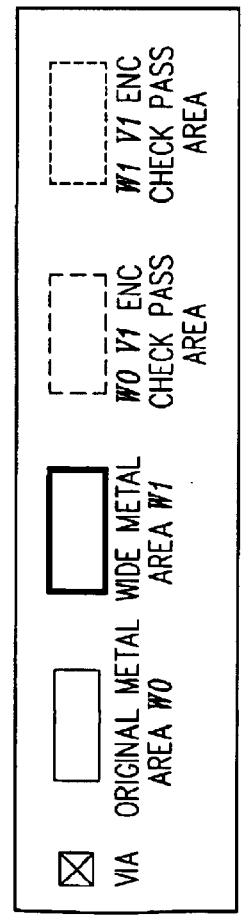

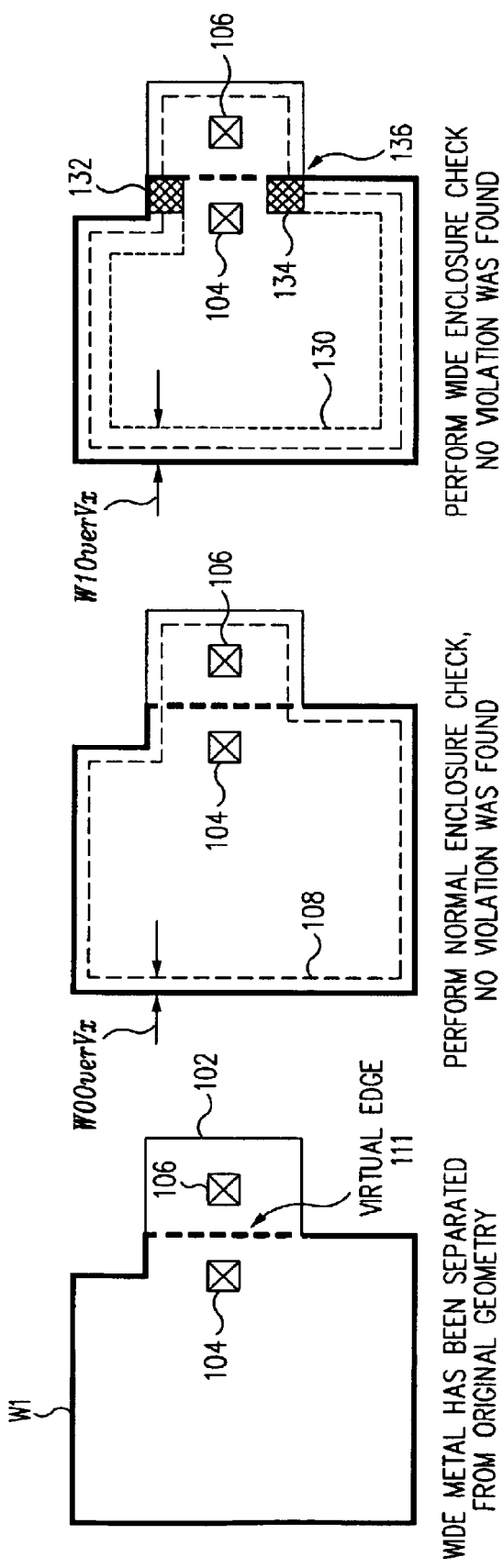
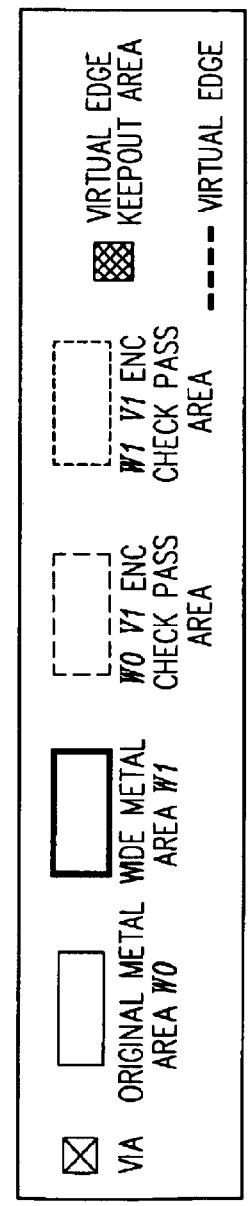
FIG. 11A  FIG. 11B  FIG. 11C

COMBINED VIOLATION REGION FOR W0, W1, W2 CLASSES

VIOLATION REGION FOR W0

VIOLATION REGION FOR W1

VIOLATION REGION FOR W2

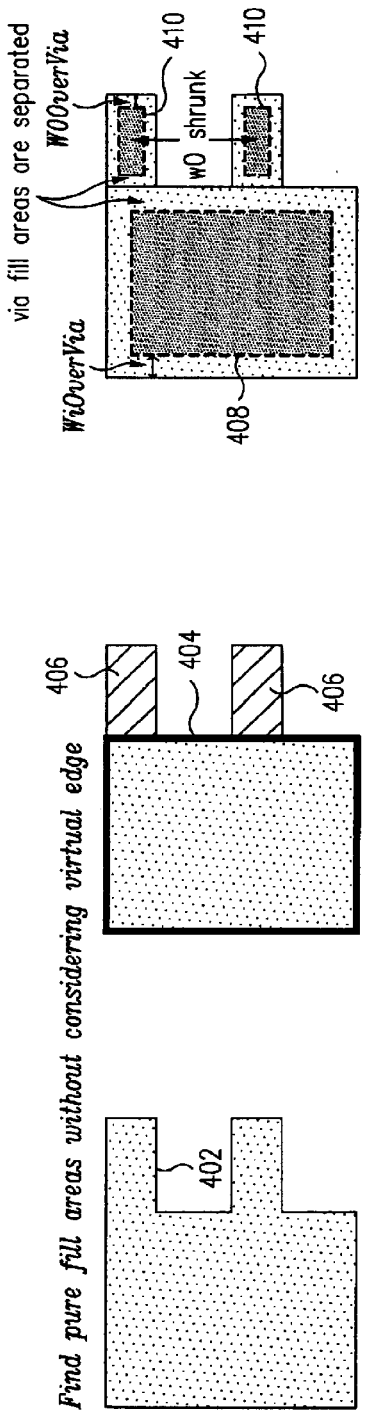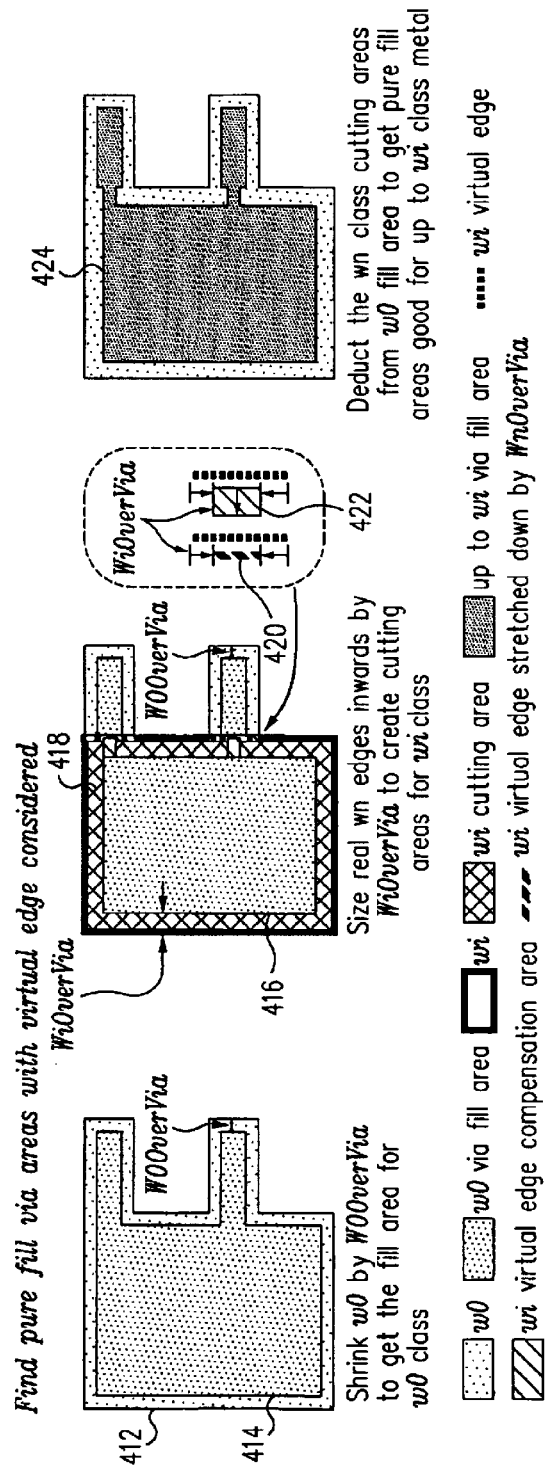

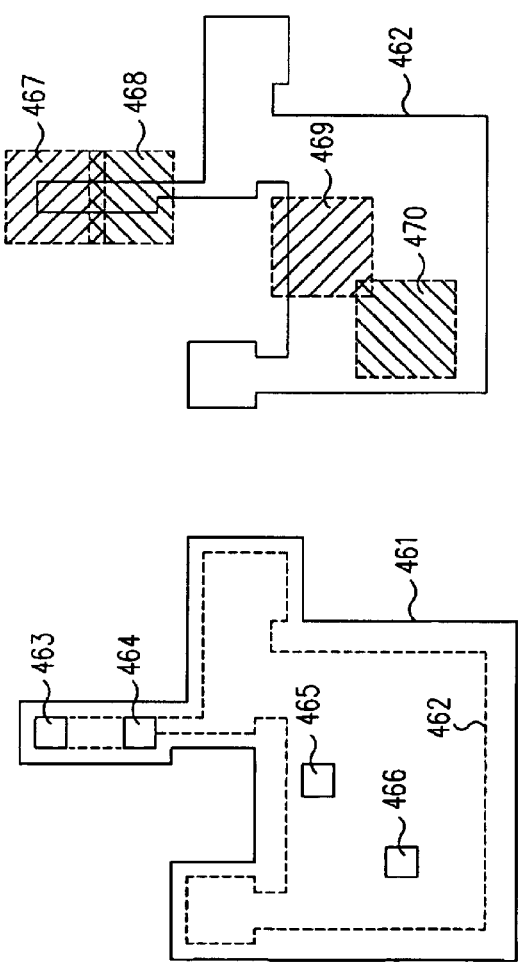
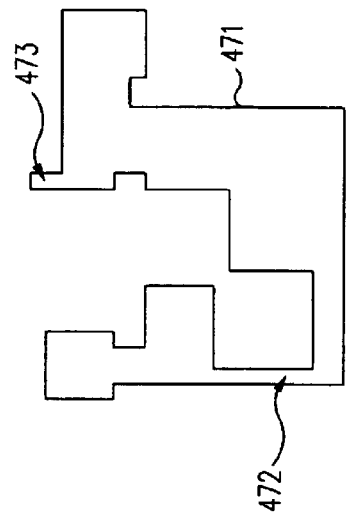
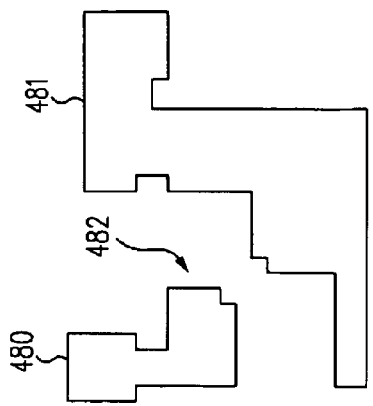
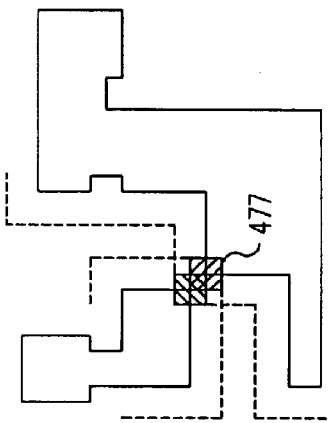
FIG. 15A
FIG. 15B
FIG. 15C
FIG. 15D
FIG. 15E
FIG. 15F

PURE FILL VIA AREA EXTRACTION IN A MULTI-WIDE OBJECT CLASS DESIGN LAYOUT

CROSS REFERENCE TO RELATED APPLICATIONS

This application is related to the following co-pending commonly-assigned U.S. patent applications, each filed on even date herewith, and each hereby incorporated by reference in its entirety: U.S. application Number No. 10/260,814 by Mu-Jing Li, entitled "Correction of Spacing Violations Between Pure Fill Via Areas in a Multi-Wide Object Class Design Layout"; U.S. application Number No. 10/260,817 by Mu-Jing Li and Amy Yang, entitled "Redundant Via Rule Check in a Multi-Wide Object Class Design Layout"; U.S. application Number No. 10/260,811 by Mu-Jing Li and Amy Yang, entitled "Via Enclosure Rule Check in a Multi-Wide Object Class Design Layout"; and U.S. application Number 10/260,813 by Mu-Jing Li and Amy Yang, entitled "Structure and Method for Separating Geometries in a Design Layout into Multi-Wide Object Classes".

BACKGROUND

1. Field of the Invention

The present invention relates to error checking and manipulation of a design layout, and more particularly to computer aided design layout and design rule verification of an integrated circuit design layout, and use thereof for circuit fabrication.

2. Background of the Invention

Design of an electronic circuit, for example, an integrated circuit (IC), is a complicated and time consuming process. FIG. 1 illustrates a typical design flow 80 of an integrated circuit device from conception through the generation of a fabrication ready design layout. Generally, design flow 80 commences with defining the design specifications or requirements, such as required functionality and timing, at step 82. The requirements of the design are implemented, for example, as a netlist or electronic circuit description, at step 84. The implementation can be performed by, for example, schematic capture (drawing the design with a computer aided design tool) or more typically, utilizing a high level description language such as VHDL, Verilog® and the like. The implemented design is simulated to verify design accuracy, at step 86. Design implementation and simulation are iterative processes. For example, errors found by simulation are corrected by design implementation and re-simulated.

Once the design is verified for accuracy with simulation, a design layout of the design is created, at step 88. The design layout describes the detailed design geometries and the relative positioning of each design layer to be used in actual fabrication. The design layout is very tightly linked to overall circuit performance (area, speed and power dissipation) because the physical structure defined by the design layout determines, for example, the transconductances of the transistors, the parasitic capacitances and resistances, and the silicon area which is used to realize a certain function. The detailed design layout requires a very intensive and time-consuming design effort and is typically performed utilizing specialized computer aided design (CAD) or Electronic Design Automation (EDA) tools.

The design layout is checked against a set of design rules in a design rule check (DRC), at step 90. The created design layout must conform to a complex set of design rules in order, for example, to ensure a lower probability of fabrication defects. The design rules specify, for example, how far apart the geometries on various layers must be, or how large or small various aspects of the layout must be for successful fabrication, given the tolerances and other limitations of the fabrication process. A design rule can be, for example, a minimum spacing amount between geometries and is typically closely associated to the technology, fabrication process and design characteristics. For example, different minimum spacing amounts between geometries can be specified for different sizes of geometries. DRC is a time-consuming iterative process that often requires manual manipulation and interaction by the designer. The designer performs design layout and DRC iteratively, reshaping and moving design geometries to correct all layout errors and achieve a DRC clean (violation free) design.

Circuit extraction is performed after the design layout is completed and error free, at step 92. The extracted circuit identifies individual transistors and interconnections, for example, on various layers, as well as the parasitic resistances and capacitances present between the layers. A layout versus schematic check (LVS) is performed, at step 94, where the extracted netlist is compared to the design implementation created in step 84. LVS ensures that the design layout is a correct realization of the intended circuit topology. Any errors such as unintended connections between transistors, or missing connections/devices, etc. must be corrected in the design layout before proceeding to post-layout simulation, step 96. The post-layout simulation is performed using the extracted netlist which provides a clear assessment of the circuit speed, the influence of circuit parasitics (such as parasitic capacitances and resistances), and any glitches that can occur due to signal delay mismatches. Once post-layout simulation is complete and all errors found by DRC are corrected, the design is ready for fabrication and is sent to a fabrication facility.

As electronic circuit densities increase and technology advances, for example, in deep sub-micron circuits, skilled designers attempt to maximize the utilization of the design layout and manufacturability and reliability of the circuit. For example, the density of a layer can be increased, additional vias added to interconnection areas, and the like. Creation of a design layout and performing DRC become critical time consuming processes. Performing a DRC and manipulation of the design layout often requires manual interaction from the designer. More reliable and automated techniques for improving the design layout are consistently desired.

In a modem semiconductor design technology, many metal layers are used to implement interconnections throughout an integrated circuit. For some integrated circuits, one or more polysilicon (poly) layers, or even active areas, are also used to implement interconnections. Vias are used to connect from one such metal or polysilicon layer to another metal or polysilicon layer. For example, a via may be used to connect a feature (i.e., a design geometry) on each of two metal layers. The lower one of the two layers is referred to as the landing metal layer and the upper one of the two layers is referred to as the covering layer. A via between a landing metal layer $mt_x$ and the covering metal layer $mt_{x+1}$ is usually referred to as a $v_x$ via (i.e., using the same subscript designation as the landing metal layer).

Most design technologies include via enclosure rules to ensure that both the landing metal and the covering metal enclose the via by a certain amount. In other words, such an enclosure rule ensures that each metal layer overlaps a via with a certain amount of extra metal, to ensure that the via provides a good connection between the two metal layers once fabricated. The design rule specifying the extra amount of metal around each via may be referred to as a metal enclosure of a via design rule, and at times simply as a via enclosure design rule.

In a modern semiconductor design technology, especially for a deep sub-micron design, poly and metal layers which are used to implement connections through vias apply different via enclosure rules depending on the width of the metal or poly in the vicinity of the via. When a via is placed in a wide metal area, it may need more metal enclosure than that of a via which is placed in a narrower metal area. When a via is partially in wide metal area and partially in non-wide metal area, it may need different metal enclosure in each different area. In general, as the design technology advances, more and more wide classes of metal features may be used in a design layout, having different metal enclosure design rules for each wide metal class. Automated design rule checks to check such different enclosure rules for multi wide class objects without causing false errors (or false passes) have been difficult to develop, and additional improvements are needed.

Moreover, it may be desirable to apply different sets of rules to geometries on a given layer depending upon their relative size. For example, design layers which are used for implementing wires (e.g., metal layers) may apply different design rules, such as spacing rules, to improve wafer fabrication results. Implementing different rule checks for different width geometries may generate false errors and require manual intervention by skilled layout designers to determine whether the "error" should be corrected. Reliable, automated techniques are needed to facilitate design rule checking or design rule violation correction on a multi wide class design.

SUMMARY

Because objects in each wide class are not real geometries, some derived wide class objects may contain virtual edges and vertices (i.e., virtual boundaries). To achieve an automatic extraction of pure fill via areas among multi wide class objects without generating erroneous areas or other false errors, the virtual boundaries of the wide objects are preferably treated differently than non-virtual boundaries. In particular, an extracted pure fill via area is preferably allowed to extend across a virtual edge of a wide class object.

In an exemplary embodiment of the invention, a method is provided for deriving one or more pure fill via areas (PFVA) for geometries on a first layer in a design layout having multiple wide class objects on the first layer. The exemplary method includes forming a current PFVA, initially as a PFVA for the wide class $w_0$ objects (i.e., the geometries of the layer), and successively adjusting the CPFVA for each higher wide class of objects to accommodate the respective enclosure rules for each higher wide object class.

In some embodiments the $w_0$ PFVA may be formed by sizing the $w_0$ objects inward by an associated via enclosure rule $w_0 \text{over} V_x$. The CPFVA may be adjusted by eliminating portions of the CPFVA lying inside the $w_i$ objects and lying within a distance equal to an associated via enclosure rule $w_i \text{over} V_x$ of any non-virtual boundary of the $w_i$ objects, to thereby form a resultant CPFVA valid for up to $w_i$ objects ($w_i$ CPFVA). The last $w_n$ CPFVA may be represented as the desired PFVA for the first layer. In some embodiments, the first layer comprises a metal layer of an integrated circuit design layout.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

FIGS. 3A–3E are design layouts which illustrate a technique for deriving a wide class object from a design geometry.

FIGS. 4A–4G are design layouts which illustrate a technique for deriving a wide class object from a design geometry having non-orthogonal edges.

FIGS. 5A–5E are design layouts which illustrate a technique for deriving an effective wide class object from a design geometry.

FIGS. 6A–6E are design layouts which illustrate a technique for selecting a whole edge of an object or geometry which partially abuts another object or geometry.

FIGS. 9A–9C are design layouts depicting vias placed within a metal geometry, and illustrate false errors which may result when applying wide object enclosure rules on the entire boundary of a wide object.

FIGS. 10A–10C are design layouts depicting vias placed within a metal geometry, and illustrate false errors which may result when applying wide object enclosure rules on the boundary of the original geometry.

FIGS. 11A–11C are design layouts depicting vias placed within a metal geometry, and illustrate the operation and results of an exemplary via enclosure check algorithm.

FIGS. 13A–13F are design layouts depicting a metal layer, and which illustrate a traditional technique for deriving pure fill via areas (PFVAs) within the metal layer, and an exemplary technique for deriving pure fill via areas within the metal layer.

FIGS. 15A–15F are design layouts depicting a metal layer, and which illustrate an exemplary technique for correcting via spacing violations between pure fill via areas and existing vias, and for correcting spacing violations between PFVAs within the metal layer.

DETAILED DESCRIPTION

In a modern semiconductor design, it is desirable to apply different sets of rules to geometries (i.e., features) on a given layer depending upon their relative size. For example, many design layers, especially those which are used for implementing gates (e.g., polysilicon layers) and wires (e.g., metal layers) may be divided into different classes depending upon their minimum width in any dimension. Objects in different classes may apply different design rules, such as spacing rules, via enclosure rules, and others, to improve wafer fabrication results.

These derived intermediate geometries may be referred to as objects to distinguish them from the original physically laid out geometries (or shapes) hereafter. When checking these kinds of objects, it is important to consider the relationship between the artificial objects and the real geometries, because only the real geometries will be fabricated into a chip.

Figure 1:
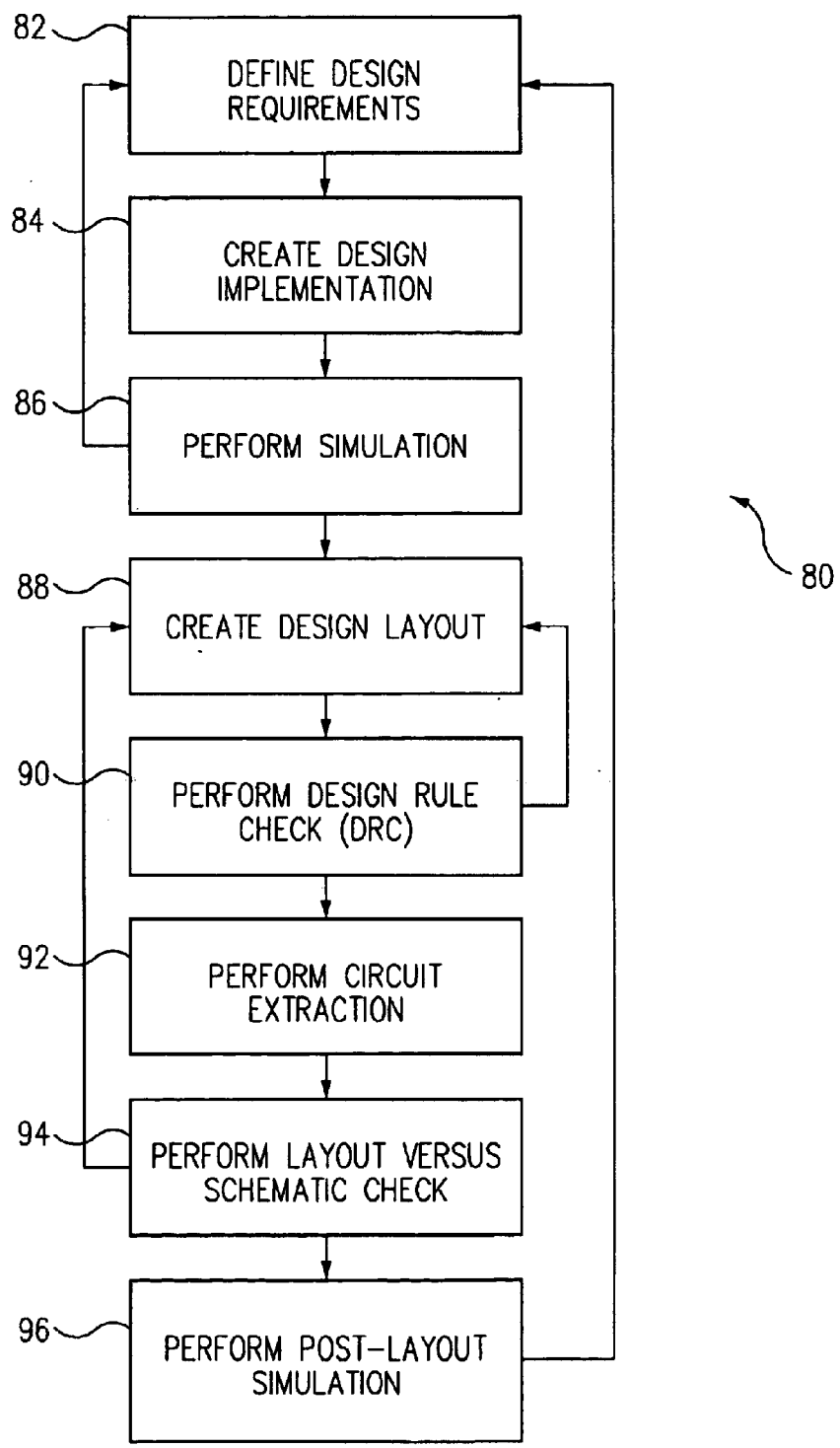
FIG. 1, labeled prior art, illustrates an exemplary design flow 100 for an integrated circuit device.
Figure 2C:
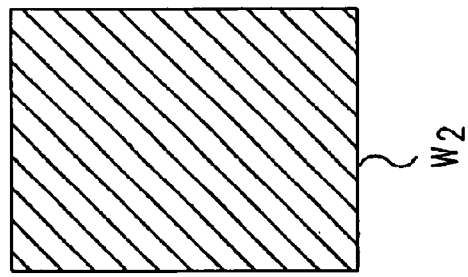
FIGS. 2A–2C are design layouts illustrating a geometry and two wide class objects derived therefrom.
Figure 2B:
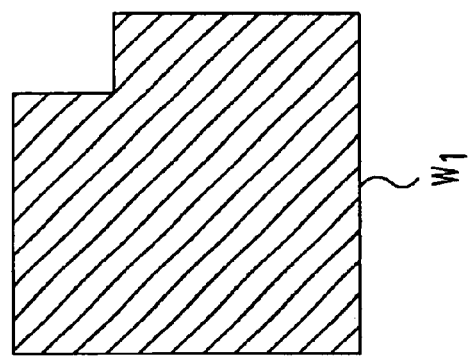
Figure 2A:
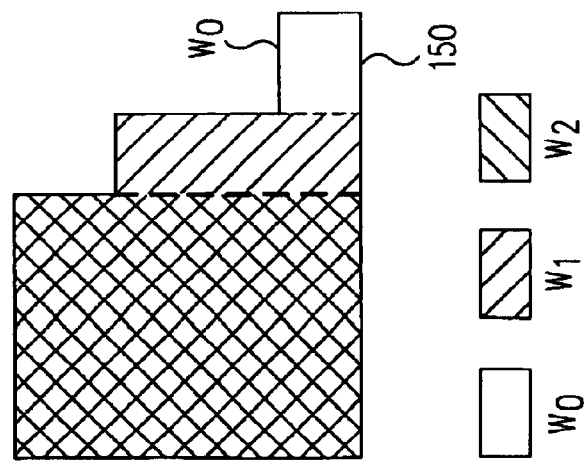
Figures 7A, 7B, 7C, 7D:
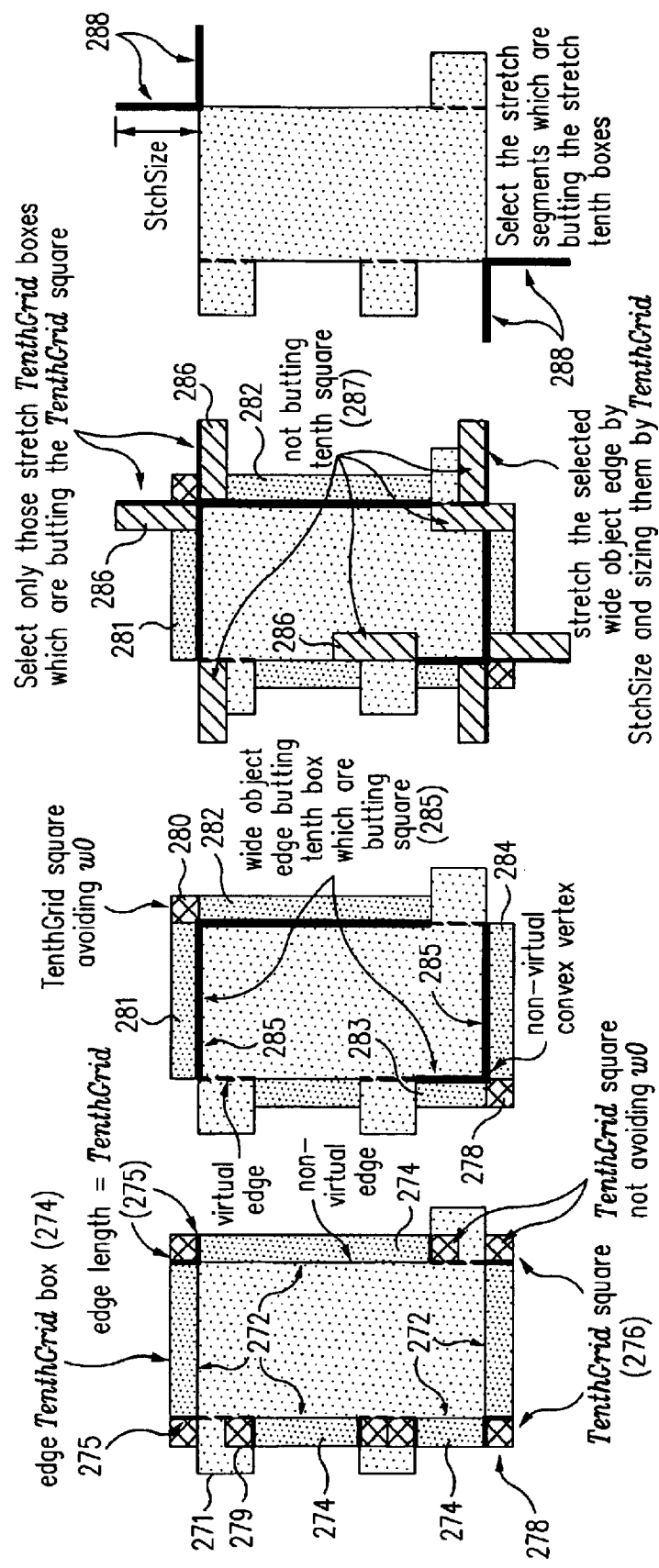
FIGS. 7A–7D are design layouts which illustrate a technique for stretching non-virtual convex vertices of an object.

FIGS. 2A–2C illustrates a geometry 150, representing typically a metal or polysilicon feature, or other such material. As illustrated in FIG. 2A, a geometry 150 can be of irregular shape. The irregular shape of a geometry may be its original drawn shape, or alternatively result from a reshaping of the geometry to conform to design rules, allowance for via placement, and other such design reasons.

Design rules are typically different for different sized geometries. For example, larger geometries require a larger amount of space between other geometries than is required by smaller geometries. Because the design rules are typically different for different sized geometries, geometries are often classified according to size. Classifying a shape such as geometry 150 can lead to several options. For example, geometry 150 can be classified according to its widest edge, applying worst case spacing requirements appropriate for the widest edge. But this is not a desirable classification technique for space restricted designs, for it may lead to needlessly large design layouts.

Separating a Geometry Into Multi-Wide Classes

According to some embodiments of the present invention, a design layout may have multiple wide classes defined, and a geometry can have multiple wide class objects of varying edges and widths, $w_0, w_1, w_2, \ldots, w_n$ derived from it. Design rules are preferably applied to each wide class object individually, resulting in a much more optimal layout. Wide class objects are derived from a geometry according to its shape and size. A wide class of a particular geometry can have any number of wide class objects, including zero. However, a particular geometry has one and only one $w_0$ wide class object, representing the geometry. Thus, "$w_0$" and "geometry" are interchangeable. Further, a $w_0$ wide class object does not need to be derived or calculated because all its edges are coincident with the original geometry. As illustrated in FIG. 2A, the geometry 150 has three wide classes, $w_0$, $w_1$, and $w_2$, each having one object. For clarity, the derived $w_1$ object is shown alone in FIG. 2B, and the derived $w_2$ object is shown alone in FIG. 2C.

FIGS. 3A–3E illustrates the deriving of wide class objects from a geometry. Typically, a sizing down and sizing up operation is performed on the edges of the geometry, for example, using an electronic design automation (EDA) tool. If any portion of the geometry remains after the two sizing operations, the remaining portion(s) may be defined as a wide class object(s). Such wide class objects are derived from the geometries, and may be exactly the same as the geometries, or may represent only a smaller portion of the geometry. As depicted in FIG. 3B, the $w_0$ object 151 is sized down by a size factor size_f, which sizing operation pushes each edge of the geometry inward by the sizing factor, eliminating areas in the geometry with width less than the size factor amount in any dimension, and resulting in the object 152 shown in FIG. 3C. In other words, sizing down deletes any small areas (e.g., "slivers") of the geometries which are not wide enough to pass the operation, such as region 153 of the $w_0$ object 151. The sizing up operation then expands the remaining sized down objects outward by the same sizing factor size_f, resulting in the object 154 shown in FIG. 3D. Thus, any small areas of the geometries are removed to form the wide class object. Therefore, after the pair of sizing operations, the resulting derived wide class object can be of a different shape than the original geometry. For a design with n wide classes, the sizing down and up operations may be repeated n times, each with the corresponding sizing factor appropriate for the wide class width amount. Wide class objects may be identified as $w_0, w_1, \ldots w_n$ with $w_0$ having all edges coincident with the geometry, and $w_1, \ldots w_n$ as objects with increasing wide class width amounts and, for example, increasing corresponding minimum spacing rule amounts.

Wide class objects are not real geometries, but rather are artificial objects. The concept of a virtual edge may be used when manipulating geometries to meet design rules to manage certain complications introduced by deriving multiple wide class objects from a geometry. Although $w_0$ objects contain all real edges (i.e., non-virtual edges) which are coincident with the edges of the geometry, higher-order wide class objects $w_1, w_2, \ldots, w_n$ can contain virtual edges. A virtual edge is defined as an edge or an edge segment of an artificial object that is not coincident with an edge of the geometry from which it was derived. In other words, a virtual edge of a wide class $w_i$ object is "inside" the geometry (i.e., $w_0$ object) from which it was derived. A virtual vertex is a vertex on the wide class object formed by at least one virtual edge, but is not a real vertex on the geometry from which it was derived. Virtual edges and virtual vertices may together be referred to as forming a virtual boundary, while conversely, non-virtual edges (i.e., real edges) and non-virtual vertices (i.e., real vertices) may together be referred to as forming a non-virtual boundary (i.e., real boundary). FIG. 3E illustrates a wide class $w_x$ object 154 with virtual edges 155 and a virtual vertex 156. Together, the virtual edges 155 and virtual vertex 156 forms a virtual boundary.

Determining a proper sizing factor size_f is important to make sure that the EDA tool properly extracts the objects for each class. The sizing factor is preferably set to a value slightly smaller than one-half of the particular wide class definition. More preferably, the value should be one which "falls off" the design grid used for actual design geometries.

The preferred sizing factor may be viewed as being set to one-half of the wide class definition minus a slight offset value. The offset value is preferably the smallest number the EDA system can handle, usually the system resolution, which is preferably ten times smaller than the design grid, although other offset values, such as up to just less than one-half of the design grid, may also be used. In the examples that follow, the offset value is set at one tenth of the design grid, represented herein as TenthGrid. This offset is large enough for the EDA system to count on it (i.e., to recognize the difference between a coordinate value with it and without it), but small enough not to be able to mix with the real design data to cause any false errors.

The DIVA® physical layout verification environment, and its associated coding language, is a well known tool for manipulating design layers and performing certain design rule checking of a design layout, and is a registered trademark of and is available from CADENCE DESIGN SYSTEMS, INC. of San Jose, Calif. An exemplary code segment written in DIVA language to perform sizing down and sizing up operations of a $w_0$ layer is illustrated below.

1 size_f=widex/2−TenthGrid
2 wx=geomSize(geomSize(w0−size_f) size_f)

Line 1 defines the sizing factor size_f to be slightly less (one tenth of a grid) than ½ of the wide class width amount. Line 2 performs a sizing down operation (geomsize the geometry by a negative sizing factor) and a sizing up operation (geomsize the sized down result by a positive sizing factor).

As an example, assume the following values: widex=7.0$\mu$, design grid=0.01$\mu$, system resolution=0.001$\mu$. Consequently, the value for TenthGrid=design grid/10= 0.001$\mu$, size_f=widex/2−TenthGrid=7.0/2−0.001=3.499$\mu$, size_f*2=3.499*2=6.998$\mu$. Because there can only be geometries with width 6.99$\mu$ or less and 7.00$\mu$ or greater, it is impossible for an object or geometry within an on-grid design layout to have a width of 6.998$\mu$.

All the geometries in $w_0$ which is 6.99 or less will be removed when the inner operation geomSize (w0−3.499) is performed, because 3.499 is bigger than 6.99/2=3.495. Those geometries with width 7.00 or greater survive this operation, because 7.00/2=3.5>3.499. Therefore, when the outer operation is performed, those original $w_0$ objects having a minimum width >=7.0 are written to the derived layer wx. As stated above, other useful values for the size factor include values as high as 3.496, which represents one-half the wide class definition (3.500) minus "just less" than one-half the design grid value (0.005).

The above description is valid for orthogonal geometries. When a geometry contains non-orthogonal (i.e., "slant") edges, an extra step of ANDing the result with the original geometry may be performed to ensure that the resulting object is correct. Referring now to FIG. 4A, an original geometry 171 with two slant edges is shown.

FIG. 4B shows that during the sizing down operation, every edge gets pushed inwards by the size factor, resulting in the intermediate object 174 (shown in FIG. 4C). As can be seen, the upper right corner slant edge 172 is farther away from the sized object 174 than the size factor. Therefore, this slant edge 172 contributes nothing to the intermediate object 174. In other words, it would be lost in the subsequent sizing up operation. As is apparent in FIG. 4C, the edges in the upper right corner of the sized intermediate object 174 are perpendicular, and any slant edge from the original geometry 171 has vanished. In contrast, the lower left slant edge 173 is long enough that, even when sized inward by the size factor, a slant edge results in the lower left corner of the intermediate object 174.

FIG. 4D shows how the sized down object 174 gets sized up by the same sizing factor, and FIG. 4E shows the erroneous object 175 that results after this sizing up operation. The resultant object 175 contains an extra part 177 in the upper right corner, which is a side effect of the sizing down and sizing up operation performed upon a geometry which contains non-orthogonal (i.e., "slant") edges. This erroneous portion may be removed by ANDing the original geometry 171 with the sized-up object 175, resulting in wide class object 176 as shown in FIG. 4F.

FIG. 4G illustrates a graphical method to determine whether this slant edge side effect will happen. First, extend the perpendicular edges which are connect to a slant edge to form a right angle corner. The slant edge and the edge extension segments together form a test triangle. Next, draw a test circle which is tangent to both edges or edge extension segments with the radius equal to the sizing factor, and check to see whether the test triangle is overlapping with any portion of the test circle. If the test triangle is not overlapping with the test circle (as shown in the upper right corner), the slant edge will disappear during the size down/size up operation. However, if the test triangle does overlap the test circle, for example as shown in the lower left corner, the slant edge will not disappear during the size down/size up operation. Consequently, if a design layout may contain slant edges, an additional step is preferably performed to AND the intermediate result (e.g., geometry 175) with the original geometry to get the final wide class objects.

The resultant objects covered thus far are the results of EDA tool, which may be referred to as mathematical wide objects. Because some geometries may contain small portions which are filtered from wide objects mathematically, but which portions may still behave with wide object characteristics based on the process, additional correction factors are preferably considered to derive the effective wide objects. For example, to better reflect processing characteristics of such geometries, it may be advantageous to adjust the wide objects by a certain correction threshold to reclaim some small areas of the geometry just outside the wide objects and otherwise excluded from the wide objects. The particular value of the correction threshold is preferably determined to accommodate the semiconductor or mask-making process employed. In one embodiment, if an area is butting with (i.e., touching) the wide object and its width is smaller than the correction threshold, it should be treated as part of the wide object, even though "mathematically" it is not part of the wide object (i.e., it is smaller than the size factor corresponding to the wide object class). An effective wide object is actually a combination of those portions having at least a certain minimum width, and an adjustment, after applying a correction factor, to add back in certain small features otherwise excluded. FIGS. 5A–5E depicts a geometry 186 having a smaller portion 188 similar to that shown in FIG. 3A, but also having a small portion 187. The geometry 186 is sized down to generate the sized intermediate object 190, and then sized up to form the wide class object 191. But here the wide class object 191 is sized by a correction factor to form a peripheral region 193 between the wide class object 191 and the sized wide class object 192, and any additional portion of the geometry 186 which falls wholly within this peripheral region 193 is added to the wide class object 191 to form the effective wide class object 194. The small area 187 is included within the effective wide class object 194 because it lies completely inside the correction threshold 192.

In general, if we have wide class definition of $wide_0$, $wide_1, wide_2, \ldots, wide_n$, we can represent the wide object sets as $w_0, w_1, w_2, \ldots, w_n$. Among them, $w_0$ is a special object set which represents all original geometries. With these definitions, an exemplary algorithm for separating a design layer, such as metal, into n different wide classes may be described in greater detail. Those wide object sets have the following relationship: $w_0 \supset w_1 \supset w_i \supset w_n$. An exemplary algorithm for deriving mathematical wide object classes is as follows:

1. Represent original geometries by the $w_0$ set (i.e., represent each original geometry as a $w_0$ object).
2. Apply a $wide_1$ test on the $w_0$ objects to generate the initial $w_1$ set. (All objects in $w_i$ can pass the $wide_i$ test.)

3. Perform AND operation on the initial $w_1$ set and the $w_0$ set to generate the $w_1$ set, to prevent erroneous oversizing up when $w_0$ objects contain slant edges. If the design layout is orthogonal, then this step is not needed.
4. Apply a wide$_2$ test on the $w_1$ objects to generate the initial $w_2$ object set. All objects in $w_2$ can pass the wide$_2$ test. Any object which could not pass the wide$_1$ test will never pass the wide$_2$ test. That is, a $w_2$ object must be contained within (i.e., having boundaries coincident with or inside) a $w_1$ object.
5. Perform AND operation on the initial $w_2$ set and the $w_0$ set to generate the $w_2$ object set, to prevent erroneous over-sizing up when $w_0$ objects contain slant edges. If the design layout is orthogonal, then this step is not needed.

While each successive wide class may be computed directly from the $w_0$ set, it is sufficient (and more computationally efficient) to calculate each successive wide class from the preceding wide class. In other words, the preferred algorithm calculates wide class from the lowest numbered to the highest numbered (widest class). In general, to get $w_n$ class objects, the wide$_n$ test only need be performed on $w_{n-1}$ class objects, because higher classes of wide objects must be contained in each lower classes of wide objects. This improves performance of the wide class separation process as each successive wide class set generally has fewer objects in the set than its predecessor set. This may be generalized as follows: Apply wide$_i$ test on the $w_{i-1}$ object set to generate the initial $w_i$ set. Then, if the design is non-orthogonal, perform an AND operation on the initial $w_i$ set and the $w_0$ set to generate the $w_i$ set. All objects in $w_i$ can pass the wide$_i$ test. In general, any object which could not pass the wide$_{i-1}$ test will never pass the wide$_i$ test. That is, a $w_i$ object must be coincident with or inside a $w_{i-1}$ object, and must be coincident with or inside a $w_{i-2}$ object, . . . , and also must be coincident with or inside a $w_0$ object.

To derive the effective wide objects from the mathematical wide objects, the above algorithm may be extended in an exemplary fashion as follows:
1. Use the above algorithm to get mathematical $w_i$ class objects.
2. Get all $w_0$ class objects which are overlapping with the $w_i$ objects.
3. Deduct the $w_i$ objects from the selected $w_0$ objects.
4. Perform a wide test with a size factor set slightly smaller than the $w_i$ correction factor or threshold.
5. Select all the objects which do not pass this wide test (i.e., are smaller than the correction factor) and which completely fall within a distance equal to the correction factor from the $w_i$ objects.
6. Merge the above selected objects to the mathematical $w_i$ objects to get effective $w_i$ objects.

An exemplary algorithm for separating a metal layer into three wide classes $w_1$, $w_2$, and $w_3$ (in addition to the original geometries being represented by the $w_0$ class) may be implemented as follows:

1 w0=geomCat(mt_good)
2 size_f=Mtwide1/2-TenthGrid
3 w1=geomSize(geomSize(w0-size_f) size_f)
4 w1=geomAnd(w0 w1)
5 non$_{13}$ w1=geomAndNot(geomOverlap(w0 w1) w1)
6 size_f=w1_cf/2-TenthGrid
7 eff_w=geomAndNot(non_w1 geomSize(geomSize (non_w1-size_f) size_f))
8 eff_w=geomInside(eff_w geomSize(w1 w1_cf))
9 eff_w1=geomOr(w1 eff_w)
10 size_f=MtWide2/2-TenthGrid
11 w2=geomSize(geomSize(w1-size_f) size_f)
12 w2=geomAnd(w0 w2)
13 non_w2=geomAndNot(geomOverlap(w0 w2) w2)
14 size_f=w2_cf/2-TenthGrid
15 eff_w=geomAndNot(non_w2 geomSize(geomSize (non_w2-size_f) size_f))
16 eff_w=geomInside(eff_w geomSize(w2 w2_cf))
17 eff_w2=geomOr(w2 eff_w)
18 size_f=MtWide3/2-TenthGrid
19 w3=geomSize(geomSize(w2-size_f) size_f)
20 w3=geomAnd(w0 w3)
21 non_w3=geomAndNot(geomOverlap(w0 w3) w3)
22 size_f=w3_cf/2-TenthGrid
23 eff_w=geomAndNot(non_w3 geomsize(geomSize (non_w3-size_f) size_f))
24 eff_w=geomInside(eff_w geomSize(w3 w3_cf))
25 eff_w3=geomOr(w3 eff_w)

In lines 2–4, the mathematical wide class $w_1$ is derived from $w_0$ objects, following the above-described algorithm. Line 5 selects all $w_0$ class objects which are overlapping with the $w_1$ objects, and deducts the $w_1$ objects from the selected $w_0$ objects to generate non-$w_1$ objects. Lines 6–7 performs a wide test on the selected non-$w_1$ objects using a size factor equal to one-half the $w_1$ correction factor minus a tenthgrid. Line 8 selects those non-$w_1$ objects falling within a $w_1$ correction factor of the $w_1$ objects, and line 9 merges this with the mathematical $w_1$ objects to generate the effective $w_1$ objects. Lines 10–17 follow analogously for generating effective wide class $w_2$ objects, and lines 18–25 likewise follow analogously for generating effective wide class $w_3$ objects.

The effective wide class objects form the foundation of many design rule checks or corrections, or design construction operations, and may thus define the virtual edges and virtual vertices. However, for other design rule checks, the use of wide class objects may refer to the mathematical wide classes described above. Unless the context is clear, wide class objects need only refer to mathematical wide class objects, although such use may also refer to effective wide class objects.

In an exemplary design layout, three wide class definitions may be utilized for a metal layer, in addition to the $w_0$ objects (i.e., the original geometries). A wide class $w_1$ object may represent any portion of the geometry wider than 0.43 $\mu$. A wide class $w_2$ object may represent any portion of the geometry wider than 2.19 $\mu$, and a wide class $w_3$ object may represent any portion of the geometry wider than 3.90 $\mu$. Exemplary correction factors corresponding to each object class may be 0.04$\mu$ for the $w_1$ objects, 0.12$\mu$ for the $w_2$ objects, and 0.18$\mu$ for the $w_3$ objects. Exemplary minimum spacing rules corresponding to each object class may be 0.18 $\mu$for the $w_0$ objects, 0.22$\mu$ for the $w_1$ objects, 0.41$\mu$ for the $w_2$ objects, and 0.84$\mu$ for the $w_3$ objects.

Transforming Between a Geometry and an Edge to Stretch an Edge Segment From a Vertex In the design rule check or DRC violation correction process, especially when dealing with multi wide class designs, we often need to stretch two edge segments from the vertex where they meet. In existing EDA tools, there is no such function available, so achieving such a capability is key to the success of implementing all kinds of corner to corner DRC check and DRC correction algorithms. Finding the location where two edge segments touch each other, determining whether a vertex is a convex one or a concave one, and stretching the segments only starting from the vertex and outwards or inwards, are technical difficulties which may be overcome using a transformation technique between shapes and edges. By using these techniques, available EDA operations may be utilized to build a complex function such as stretching edges from a convex vertex by a certain amount.

In a DRC extraction, we typically have two type of selections. A geometry selection is performed to select certain type of geometries which meet one or more specific conditions. In this case, the geometries selected are complete geometries even if only part of the geometry meets the conditions. In contrast, an edge selection is performed to select certain type of geometry edges or edge segments which meet one or more specific conditions. In this case, only the edges or the part of the edge segments which meet the conditions are typically selected. Sometimes, we want to select a whole edge or edge segment, but only part of the edge meets the conditions. This is a particular difficulty in implementing some of the design rule check or violation corrections, especially for those designs with multi wide metal class and corner-corner spacing rules.

To resolve this technical difficulty, we can take advantage of the fact that geometries are selected in their entirety, to transform an edge selection problem into a geometry selection problem. By using the selected geometries, we can then get the whole edge or edge segment we want. Conversely, we can also take advantage of the fact that edges may be partially selected to transform a whole geometry selection problem into an edge selection problem and therefore, to a partial geometry selection.

It is important to transform an edge or edge segment into a geometry which is under full control, but which will not cause any false selection. Preferably, TenthGrid width boxes are created from the edges, although a box having a width of a minimum resolution of the CAD tool is also contemplated. Such a TenthGrid width box contains the following advantages or features:

1. At least two of the four edges of this kind of box are of length TenthGrid, so part of the geometry is measurable. In an extreme case, it is a TenthGrid square with all four edges of length TenthGrid.
2. One of the other two edges is the original edge or edge segment, and the remaining edge is pushed out by TenthGrid.
3. This kind of geometry will never be mixed with a real design geometry, because a TenthGrid box has two vertices off-grid.

With these features as a bridge, we can go through the edge-to-geometry and geometry-to-edge selections back and forth to select the whole edge or edge segment we want. FIGS. 6A–6E illustrate how such a method works for a very simple case. In this example, there are two different geometries A and B, and they are butting each other. What we want to do is to find (i.e., select) the complete edge on geometry A (also labeled 250) which is partially butting geometry B (also labeled 251). This may be accomplished by the following exemplary algorithm:

1. Select the edge segment on A which is butting B (e.g., resulting in segment 252 shown in FIG. 6B). Although segment 252 it is part of one edge of A, it does not represent the complete edge on A. As described below, the complete edge may be identified by performing an edge to geometry transformation.
2. Size the butting edge segment by TenthGrid to form an Edge Segment TenthGrid Box (labeled 254 in FIG. 6C), thus transforming the butting edge segment 252 into a geometry 254 of the same length.
3. Get all edges from A and sizing them outward also by TenthGrid to form Edge TenthGrid Boxes (labeled 256 in FIG. 6C), thus transforming the geometry A edges into respective geometries.
4. Select the geometry A Edge TenthGrid Box which is coincident with (i.e., overlaps) the butting Edge Segment TenthGrid Box. The desired edge of the original A geometry 250 is contained both in the selected Edge TenthGrid Box 258 and in the original A geometry 250.
5. Select the edge on geometry A which is butting the selected Edge TenthGrid Box 258, thus performing a geometry to edge transform to get the desired edge. The final resultant edge 260 is shown in FIG. 6E.

In the above example, the term "geometry" is used in contrast to an "edge", and is not to be taken to presume the algorithm must operate on original shapes or geometries in the design layout. Rather, the algorithm may operate on any original geometry or derived objects.

An exemplary use of such an edge-to/from-geometry transformation technique is an algorithm which outputs the stretched segments from the input edge segments which are forming a convex vertex. This exemplary algorithm can be widely used in other corner-to-corner spacing rule check or DRC violation correction algorithms.

The exemplary algorithm takes BaseClass, StchSize, and InEdge as inputs to specify the base class objects where the vertices are resident, the stretch amount, and the input edge segments respectively. The InEdge is an edge segment set which is used to find the convex vertices created by any two of them and to stretch them outwards from the vertices, and they can be in a different class from BaseClass. For example, the InEdge segments may represent non-virtual edges of a higher order object class relative to the BaseClass objects, which may represent $w_0$ objects.

The exemplary algorithm described above may be implemented straightforwardly in DIVA code to stretch edges at convex vertices as follows:

```
1  edge_tenth_box=geomSize(InEdge TenthGrid)
2  tenth_edge=geomGetLength(edge_tenth_box length==
   TenthGrid)
3  tenth_box=geomSize(tenth_edge TenthGrid)
4  v_tenth_box=geomAvoiding(tenth_box BaseClass)
5  v_but_box=geomSize(tenth_edge-TenthGrid)
6  v_tenth_box=geomButting(v_tenth_box v_but_box
   keep==2)
7  edge_v_edge_box=geomButting(edge_tenth_box
   v_tenth_box)
8  edge_v_edge=geomGetEdge(edge_v_edge_box butt-
   ing InEdge)
9  edge_v_stch=geomStretch(edge_v_edge StchSize)
10 edge_v_stch=geomAndNot(edge_v_stch edge_v_
   edge)
11 edge_v_stch_box=geomSize(edge_v_stch TenthGrid)
12 edge_v_stch_box=geomButting(edge_v_stch_box
   v_tenth_box)
13 edge_v_stch=geomGetEdge(edge_v_stch_box butt-
   ing edge_v_stch)
14 edge_v_stch=geomStretch(edge_v_stch TenthGrid)
15 edge_v_stch=geomOr(edge_v_stch)
16 edge_v_stch=geomStretch(edge_v_stch-TenthGrid)
```

The above code statements represent a "convex stretch" module that may be referred to as Convex_Stch.rul by other code segments described herein. The operation of this exemplary algorithm may be described in reference to FIGS. 7A–7D, which show an object 271 representing a BaseClass object (e.g., a $w_0$ object of a given layer). Also depicted are a set of edges 272 representing the InEdge set of edges (e.g., representing non-virtual edges of a higher-order object class of the $w_0$ object).

The operation of this exemplary algorithm, as represented by the above code module, can be described as follows:

1. Size the input edge InEdge outward by TenthGrid to form Edge TenthGrid Boxes (labeled 274) having a width of TenthGrid. (line 1 of the code module)
2. Get all edges from the just created Edge TenthGrid Boxes with length equal to TenthGrid, labeled 274. (code module line 2)
3. Size these TenthGrid length edges outward by TenthGrid to form TenthGrid Squares (labeled 276) which, as described below, serve a very important role in locating the proper stretched segments. (code module line 3)
4. Select those TenthGrid Squares which are not contained within BaseClass objects. (code module line 4) In other words, only those TenthGrid Squares which share a corner with a convex vertex of a BaseClass object are selected.
5. Select those Edge TenthGrid Boxes which are butting a TenthGrid Square. (code module lines 5–7) These TenthGrid Squares must be butting exactly two Edge TenthGrid Boxes. This step ensures that the related Edge TenthGrid Boxes are touching at least one convex vertex. For example, TenthGrid Square 280 abuts both Edge TenthGrid Boxes 281 and 282, while TenthGrid Square 278 abuts both Edge TenthGrid Boxes 283 and 284. Therefore, both edges which form the vertex are non-virtual edges. Some of the Edge TenthGrid Boxes might be butting one TenthGrid Sqaure at each end. For example, TenthGrid Square 279 abuts only one Edge TenthGrid Box 274.
6. Select the original edge segments from the Edge TenthGrid Boxes which are butting TenthGrid square boxes (selected edges labeled as 285 in FIG. 7B) (code module line 8).
7. Stretch the selected edges 285 by StchSize (code module line 9), and keep only the Stretched Segments by deducting the selected edges 285 from the stretched edges (code module line 10).
8. Size the stretched segments inward (of the original geometry) by TenthGrid to form Stretched Segment TenthGrid Boxes, labeled as 286 in FIG. 7C. (code module line 11)
9. Select only those Stretched Segment TenthGrid Boxes which are butting the TenthGrid Squares (code module line 12), because when an edge gets stretched, it is stretched at both ends evenly, so we need filter out those Stretched Segment TenthGrid Boxes (e.g., Stretched Segment TenthGrid Boxes 287) which are not butting a TenthGrid Square.
10. Finally, select edges from those remaining Stretched Segment TenthGrid Boxes which are butting the Stretched Segments (code module line 13), so the resultant stretched segments will have the same facing direction as those original edges in the InEdge.
11. Because the Stretched Segment TenthGrid Boxes could be a polygon when one box crosses another, so the edges might be broken by TenthGrid at the point where they are crossing. To resolve the side effect, we then stretch the selected edges by Tenth Grid to close the possible gap (code module line 14), merge the segments (because edges will not be automatically merged as geometries do) (code module line 15), and then stretch the merged segments by—TenthGrid to output complete stretched segments 288 shown in FIG. 7D. (code module line 16)

The following exemplary rule module stretches edges at a concave vertex, and also uses TenthGrid box techniques to transform geometries and edges extensively.

```
1 edge_tenth_box=geomSize(InEdge-TenthGrid)
2 tenth_edge=geomGetLength(edge_tenth_box length==TenthGrid)
3 tenth_box=geomSize(tenth_edge TenthGrid)
4 v_tenth_box=geomButtOrOver(tenth_box BaseClass)
5 v_but_box=geomsize(tenth_edge-TenthGrid)
6 v_tenth_box=geomButting(v_tenth_box v_but_box keep==2)
7 edge_v_edge_box=geomButting(edge_tenth_box v_tenth_box)
8 edge_v_edge=geomGetEdge(edge_v_edge_box coincident InEdge)
9 edge_v_stch=geomStretch(edge_v_edge StchSize)
10 edge_v_stch=geomAndNot(edge_v_stch edge_v_edge)
11 edge_v_stch_box=geomSize(edge_v_stch TenthGrid)
12 edge_v_stch_box=geomButting(edge_v_stch_box v_tenth_box)
13 edge_v_stch=geomGetEdge(edge_v_stch butting edge_v_stch_box)
14 edge_v_stch=geomStretch(edge_v_stch TenthGrid)
15 edge_v_stch=geomOr(edge_v_stch)
16 edge_v_stch=geomStretch(edge_v_stch-TenthGrid)
```

The difference between the convex and concave cases is that a different type of TenthGrid square gets used. The exemplary code is identical except for three differences, which may be found at line 1 (algebraic sign of TenthGrid is negative), at line 4 (function geomButtOrOver invoked rather than function geomAvoiding), and at line 8 ("coincident" argument specified instead of "butting" argument).

Spacing Rule Check Among Multi Wide Class Objects

As described above, objects in each wide class are not real geometries, but are derived from the original geometries. A given wide object may contain one or more virtual edges and virtual vertices, collectively referred to virtual boundaries. It is important to develop an algorithm to perform a spacing design rule check among multi wide class objects which deals with those virtual edges and virtual vertices to prevent false errors or a false positive (false pass).

To implement an exemplary algorithm, the wide class object sets (i.e., wide classes of objects) are derived for the layer to be checked and are represented, as before, as $w_0, w_1, w_2, \ldots, w_n$. A spacing check is preferably performed by checking all $w_0$ object edges and vertices against other $w_0$ objects, since there are no virtual boundaries on $w_0$ objects. Any violation at this operation is real violation and can be flagged as such. While not required, it is convenient to consider checking the original geometries (i.e., $w_0$ objects) first.

In addition, each wide object class $w_i$ is checked against the $w_0$ objects, but only the real boundaries are considered. In other words, the real edges and vertices of each higher class object $w_i$ is checked against the $w_0$ objects. This ensures that a spacing violation represents a violation between two original geometries or between two edges of an original geometry, and that virtual edges are not flagged as violations. Generally, each of the higher class objects $w_1, w_2, \ldots, w_n$ is checked against the $w_0$ object class, and any checks between or among higher class objects ($w_1, w_2, \ldots, w_n$) is unnecessary. For example, a $w_2$ object does not need to be compared to another $w_2$ object, nor to any $w_1$ objects.

In a preferred embodiment described below, the $w_0$ class is checked against itself using its respective spacing rule, then the $w_1$ objects are checked against the $w_0$ objects using its respective wide class spacing rule, then the $w_2$ objects are checked against the $w_0$ objects using its respective wide class spacing rule, and continuing until the $w_n$ objects are checked against the $w_0$ objects using its respective wide class spacing rule. If the various object classes are all derived, these checks may be performed in any order, although it is convenient to check each class in increasing order.

As with traditional spacing checks, the ability to recognize a "notch" formed by edges of a single geometry, and to test the notch as if it were an external spacing between two objects using an external spacing rule, is very desirable. When testing the $w_0$ objects, such a notch test is preferably incorporated. In the described exemplary techniques, such a notch is recognized by checking $w_0$ edges against other $w_0$ edges. But if a derived higher class object contains a notch, a specific notch test for the higher class object may not be required. For example, by checking the real edges of a $w_i$ class object against any $w_0$ edges, a notch in a $w_i$ object that is formed on both sides by real (i.e., non-virtual) $w_i$ edges means that the edges forming such a notch are also $w_0$ edges, and will be tested by checking the real $w_i$ edges against $w_0$ object edges.

When performing the corner-to-corner check, a check box of an appropriate size (corresponding to the $w_i$ corner spacing rule) is preferably generated at each non-virtual vertex of a given $w_i$ object, and any $w_0$ objects which overlap a check box are flagged as violations. Such check boxes are not generated at the virtual vertices of the $w_i$ objects, and consequently false errors will not be generated at the virtual vertices.

The following exemplary DIVA code may be used to perform a $w_x$ spacing rule check:
1 edge_ck=geomGetEdge(wmt coincident w0)
2 error_sep=drc(edge_ck w0 0<sep<ClassSpacing opposite)
3 sprintf(mes_err "%s %s spacing<%0.2f" Rule Mt ClassSpacing)
4 saveDerived(error_sep mes_err)
5 BaseClass=geomCat(w0)
6 StchSize=ClassSpacing
7 InEdge=geomCat(edge_ck)
8 load("convex_stch.rul")
9 edge_stch_box=geomSize(edge_v_stch ClassSpacing)
10 error_box=geomOverlap(edge_stch_box w0)
11 sprintf(mes_err "%s %s dead zone<%0.2f" Rule Mt ClassSpacing)
12 saveDerived(error_box mes$_{13}$ err)

The above code statements represent a spacing rule check module that may be referred to as SpacingRule.rul by other code segments herein, and for any wide class spacing check in an overall rule check flow.

In line 1 above, the layer wmt represents the $w_i$ object layer to be checked against the $w_0$ object layer, and the edge_ck layer is generated as the $w_i$ object edges that are coincident with the $w_0$ object edges (i.e., the real edges of the $w_i$ objects). In code line 2 a separation check is performed between opposite edges of the wmt layer and the $w_0$ layer, using a respective spacing rule ClassSpacing for the $w_i$ object class. In code line 3, a textual error message is formatted using the current values of certain variables, which message is attached to each identified error from the edge separation test and the error layer error_sep saved in line 4.

Lines 5–7 set the value for certain arguments BaseClass, StchSize, and InEdge, and then invoke the convex_stch routine (described above) to stretch the $w_i$ edge segments forming a non-virtual vertex. In line 9 these stretched edge segments edge_v_stch are sized into a check box created on the edge_stch_box layer, and then in line 10 any such check box overlapping a $w_0$ object is identified and written to a error_box layer. In code line 11, a textual error message is formatted using the current values of certain variables, which message is attached to each identified error box from the overlap test and the error layer error_box saved in line 12.

In general, for an n wide class design technology, an exemplary spacing design rule check that includes a corner to corner spacing check may advantageously invoke the above SpacingRule.rul module for each object class to be tested, as in the following exemplary DIVA code:
1 rule_file=sprintf(nil "%s/SpacingRule.rul" ruldrr)
2 w0=geomCat(mt_good)
3; Check w0 to w0
4 wmt=geomCat(w0)
5 ClassSpacing=MtxToMtx
6 Rule="Rx0"
7 Mt="mtx"
8 load(rule_file)
9; Check w1 to all classes
10 wmt=geomCat(w1)
11 ClassSpacing=MtxToMtxWide1
12 Rule="Rx1"
13 Mt="wide1 mtx"
14 load(rule_file)
15; Check wi to all classes
16 wmt=geomCat(wm)
17 ClassSpacing=MtxToMtxWidem
18 Rule="Rxi"
19 Mt="Widei mtx"
20 load(rule_file)
21; Check wn-1 to all classes
22 wmt=geomCat(wn-1)
23 ClassSpacing=MtxToMtxWiden-1
24 Rule="Rxn-1"
25 Mt="Widen-1 mtx"
26 load(rule_file)
27; Check wn to all classes
28 wmt=geomCat(wn)
29 ClassSpacing=MtxToMtxWiden
30 Rule="Rxn"
31 Mt="Widen mtx"
32 load(rule_file)

In line 4, the layer wmt is defined as the $w_0$ object layer, and in line 5 the associated spacing rule is loaded into the variable ClassSpacing. In lines 6–7 the variables Rule and Mt are loaded with identifying text for labeling any identified errors, and in line 8 the SpacingRule module is loaded and executed (as described above). Each of the next four blocks of code reassigns the layers and variables for the next higher level object class, and invokes the SpacingRule module. As can be appreciated, each successively higher-order $w_i$ object class is checked against the $w_0$ object class.

Figure 8C:
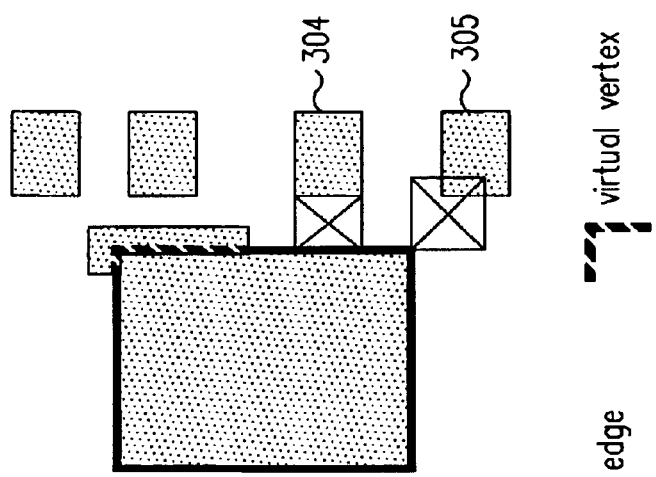
FIGS. 8A–8C are design layouts which illustrate the results of a technique for performing a minimum spacing DRC check among wide class objects which eliminates false errors otherwise resulting from corner-to-corner checks to virtual vertices, and otherwise resulting from spacing checks to virtual edges.
Figure 8B:
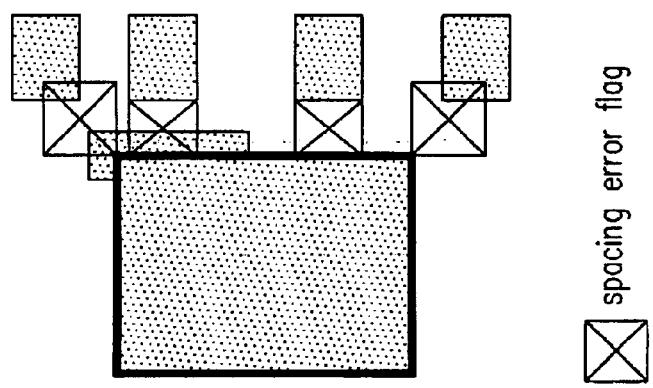
Figure 8A:
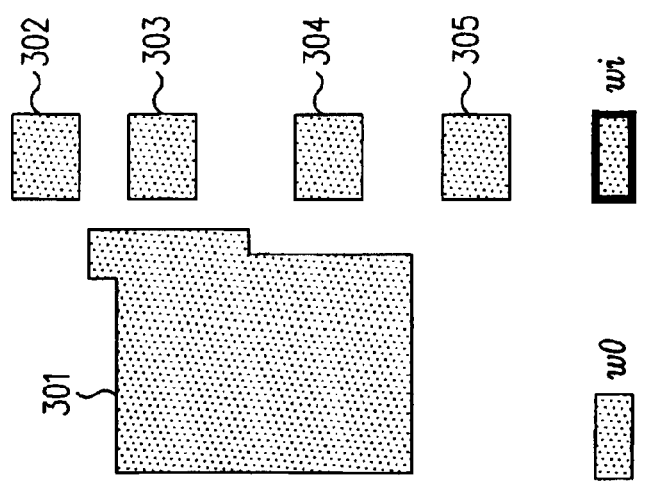

Referring now to FIGS. 8A–8C, the results of such an exemplary rule check which uses only the non-virtual edges and vertices of higher class objects are contrasted against traditional techniques using all the edges and vertices of the higher class objects. FIG. 8A shows five geometries on a given layer to be tested. One large $w_0$ object 301 is shown with four neighboring smaller $w_0$ objects 302, 303, 304, 305. FIG. 8B shows the flagged errors that would result for a $w_i$ class spacing check which uses all edges and vertices of the $w_i$ object derived from the large $w_O$ object. All four non-$w_i$ class small objects 302, 303, 304, 305 are flagging as violations. FIG. 8C shows the flagged errors that result for a $w_i$ class spacing check as described above which uses only the virtual edges and virtual vertices of the higher class object. Only two non-$w_i$ class objects 304, 305 are shown flagging as violations.

It should be appreciated that such a spacing check is preferably implemented using effective wide class objects (as defined herein), but may also be implemented using wide class objects.

Enclosure Rule Check Among Multi Wide Class Objects

When a via is placed within a wide metal object, it may need more metal enclosure than that of a via which is placed within a non-wide metal object. When a via is partially within wide metal area and partially within a non-wide metal area, it may need different metal enclosure in each different area.

To aid in understanding, a metal 1 (m1) to via 1 (v1) enclosure check is used as an example to illustrate substantive differences between exemplary algorithms which accommodate virtual boundaries of the wide objects, and traditional algorithms which typically treat the wide object as if it were a real geometry (having no virtual edges or vertices). In the examples that follow, three wide classes $w_0$, $w_1$, and $w_2$ are described, but the same methods and techniques may be easily extended to additional wide classes.

For any of the enclosure algorithms that follow, the wide objects are derived for each wide class object set, preferably as described above. Nonetheless, unless the context requires otherwise, as used herein a wide class object set may refer to both a wide class object set and/or an effective wide class object set.

An enclosure check is a common function that is available in most EDA tools. This kind of check usually measures the enclosure of geometries on one layer by geometries on another layer. Frequently, this kind of operation measures the distance between inside facing edges of the "enclosing" layer geometries to outside facing edges of geometries on the "enclosed" layer. In DIVA, a metal1-to-via1 enclosure check (m1 enclosure of v1) check can be performed as follows:

enc_error=drc(m1 v1 enc<M1OverV1 "m1 enc v1 violation")

This function checks whether the edges of the tested objects or geometries are enclosed, not the objects or geometries themselves, and does not guarantee that a geometry on one layer is completely inside another. Since this kind of check is only applied on the edges of the given layer objects, it has no idea of whether an object is a derived wide object or an original geometry. Consequently, it also has no idea how to distinguish whether an edge is a real edge or a virtual edge.

Such virtual edges may generate false errors when traditional techniques such as a simplistic enclosure function is performed on each wide class object set. One traditional algorithm may be coded in DIVA as follows:

21 drc(w0 good_v1 enc<M1OverV1 "m1 enc v1<M1OverV1")
22 drc(w1 good_v1 enc<M1Wide1OverV1 "wide1 m1 enc v1<M1Wide1OverV1")
23 drc(w2 good_v1 enc<M2Wide1OverV1 "wide2 m1 enc v1<M1Wide2OverV1")

FIGS. 9A–9C illustrate a false error that can be generated by this traditional algorithm. Referring now to FIG. 9A, a metal geometry 102 is shown with two vias 104, 106 placed within the geometry 102. FIG. 9B shows the result of a traditional enclosure check of the w0 metal objects, as coded at line 21 above. Both vias 104, 106 pass the test because both are enclosed by the w0 object by at least the required W0OverVx distance, shown here as a dashed line 108 (and coded at line 21 as "M1OverV1"). Said differently, the distance between each via 104, 106 and the closest edges of the $w_0$ object 102 is at least the W0OverVx distance.

FIG. 9C shows the result of a traditional enclosure check of the w1 metal objects, as coded at line 22 above. Via 106 passes because it is totally outside the w1 object. However, via 104 fails because it is not completely enclosed by the w1 object by at least the required W1OverVx distance, shown here as a dashed line 110, and is thus flagged as a violation. In other words, at least one of the via 104 edges falls outside the area bounded by line 110 (which is inside the $w_i$ object by the W1OverVx distance), and is thus closer to the wide object $w_i$ edge than the required enclosure amount. In this case, the violation is between a virtual edge 111 of the w1 object and one of the via 104 edges. However, this is false violation of the rule since the via 104 actually is enclosed by the required W1OverVx distance. In this case, some of the required metal enclosure of via 104 happens to fall outside the w1 object.

Another traditional algorithm may perform a $w_1$ enclosure rule on $w_0$ objects for those vias which are overlapping the $w_1$ objects. Exemplary DIVA code for this algorithm may be written as:

31 drc(w0 good_v1 enc<M1OverV1 "m1 enc v1<M1OverV1")
32 v1 w1=geomOverlap(good_v1 w1)
33 drc(w0 v1_w1 enc<M1Wide1OverV1 "wide1 m1 enc v1<M1Wide1OverV1")
34 v1_w2=geomOverlap(v1_w1 w2)
35 drc(w2 v1_w2 enc<M2Wide1OverV1 "wide2 m1 enc v1<M1Wide2OverV1")

FIGS. 10A–10C illustrate another kind of false error that can be generated by this second traditional algorithm. Referring now to FIG. 10A, a metal geometry 112 (also labeled w0) is shown with two vias 114, 116 placed within the geometry 112. FIG. 10B shows the result of a traditional enclosure check of the w0 metal objects, as coded at line 31 above. Both vias 114, 116 pass the test because both are enclosed by the w0 object by at least the required W0OverVx distance (coded at line 31 as "M1OverV1"), and represented here as a dashed line 118.

FIG. 10C shows the result of performing a $w_1$ enclosure rule on $w_0$ objects for those vias which are overlapping the $w_1$ objects, as coded at line 32–33 above. Both vias 114 and 116 at least partially overlap the $w_1$ object, and thus are both selected at line 32. Via 114 passes because it is completely enclosed by the $w_0$ object by at least the tested W1OverVx distance (coded at line 33 as "M1Wide1OverV1"). However, via 116 fails the test because it is not completely enclosed by the w0 object by at least the tested distance of W1OverVx, and is thus flagged as a violation. However, this is false violation of the $w_1$ enclosure rule since the via 116 straddles a virtual edge 121 of the $w_1$ object and falls partially outside the $w_1$ object. Such a via is not properly subject to the $w_1$ rule. The via 116 enclosure by the $w_0$ object is proper, and no violation actually exists. In this case, some of the via 116 happens to fall outside the $w_1$ object. The false error is generated because the $w_1$ rule has been applied to the $w_0$ object.

An exemplary DIVA coding for an improved method is listed below:

```
41 drc(w0 v1 enc<M1OverV1 "m1 enc v1<M1OverV1")
42 w1_edge=geomGetEdge(w1 coincident w0)
43 drc(w1_edge good_v1 enc<M1Wide1OverV1 "wide
    m1 enc v1<M1Wide1OverV1")
44 w_edge=geomGetEdge(w1 inside w0)
45 w_edge_s=geomStretch(w_edge–M1Wide1OverV1)
46 w_edge_st=geomAndNot(w_edge w_edge_s)
47 ck_box=geomSize(w_edge_st–M1Wide1OverV1)
48 via_out=geomOverlap(ck_box v1)
49  saveDerived(via_out  "wide  m1  enc
    v1<M1Wide1OverV1")
50 w2_edge=geomGetEdge(w2 coincident w0)
51 drc(w2_edge good_V1 enc<M1Wide2OverV1 "wide
    m1 enc v1<M1Wide2OverV1")
52 w_edge=geomGetEdge(w2 inside w0)
53 w_edge_s=geomStretch(w_edge–M1Wide2OverV1)
54 w_edge_st=geomAndNot(w_edge w_edge_s)
55 ck_box=geomSize(w_edge_st–M1Wide2OverV1)
56 via_out=geomOverlap(ck_box v1)
57  saveDerived(via_out  "wide  m1  enc
    v1<M1Wide2OverV1")
```

FIGS. 11A–11C represent the results of such an exemplary coding. In FIG. 11A two vias 104, 106 are placed within a geometry 102. The $w_1$ object derived from the geometry 102 is also shown, having a virtual edge 111 shown as a dashed line and having remaining non-virtual (i.e., real) edges shown as solid bold lines. FIG. 11B shows the result of the traditional enclosure check of the $w_0$ metal objects, as coded at line 41 above, which is identical to that shown in FIG. 9A. Both vias 104, 106 pass the test because both are enclosed by the $w_0$ object by at least the required W0OverVx distance, shown here as a dashed line 108 (and coded at line 41 using the argument "M1OverV1").

The code lines 42–49 are described in the context of FIG. 11C. At line 42, the non-virtual edges (i.e., real edges) of the $w_1$ objects are located by selecting those $w_1$ object edges which coincide with the $w_0$ object edges. At line 43, an enclosure test is performed to check proper $w_1$ rule enclosure of the vias by the non-virtual edges just identified. This test will locate failing vias everywhere except possibly at or near the ends of each virtual edge.

In this embodiment a "keep out" box (also referred to as a keep out area) is created on the inside of the $w_1$ object at each end of a $w_1$ virtual edge. These keep out boxes are the same size as the $w_1$ enclosure rule distance W1OverVx, and any via overlapping a keep out box is a true error. Other vias which may cross, or be close to, the virtual edge are not true failing vias, and are not flagged as errors. The keep out boxes are generated at lines 44–47. At line 44, the virtual edges of the $w_1$ objects are located by identifying $w_1$ object edges falling inside (not coincident with) a $w_0$ object. In the example shown in FIG. 11A, virtual edge 111 will be selected by this step. Then, at line 45, the virtual edges are stretched inward by a negative amount equal to the $w_1$ enclosure rule distance W1OverVx (coded in line 45 as M1Wide1OverV1), thus creating a "shortened" version of the virtual edges on the w_edge_s layer. At line 46, the portion of the virtual edges which extend past the shortened virtual edges are identified, using an ANDNOT function, to form a w_edge_st layer which represents just the end-most W1OverVx portion of each virtual edge. These end-most virtual edge segments are then sized at line 47 by a negative amount (i.e., sized inward) equal to the $w_1$ enclosure rule distance W1OverVx to build each keep out box 132, 134.

Having now created the keep out boxes, any via which overlaps a keep out box is identified and written to a saved layer via_out with a text attribute identifying the particular error, as shown at lines 48–49. In the example shown in FIG. 11C, both vias 104, 106 pass because neither overlaps either of keep out boxes 132 or 134, and both also passed the non-virtual edge enclosure test (line 42). No via enclosure test is performed using the $w_1$ virtual edges. Instead, the keep out boxes (i.e., virtual edge end keep out areas) are generated to flag a via which either crosses or abuts a virtual edge and which is placed too close to a $w_0$ object corner, such as corner 136, which is not a $w_1$ object corner (i.e., too close to a virtual edge end). A via which either crosses or abuts a virtual edge will not be tested by a traditional enclosure test because the outside edge of the via is either abutting or outside the virtual edge. Using a technique such as the exemplary algorithm described above, a via which either crosses or abuts a virtual edge will pass the enclosure test unless it falls too close to an end of the virtual edge.

At lines 50–57, an analogous test sequence is performed on the $w_2$ objects, using a corresponding $w_2$ enclosure rule distance W2OverVx (and coded as M1Wide2OverV1), and need not be separately described.

In general, this exemplary algorithm may be generalized for n different wide class object sets represented as $w_0$, $w_1$, $w_2$, ... $w_n$. For a specific wide class i (1<i<=n), the algorithm can be described as:

1. Select the non-virtual edges of the $w_i$ objects.
2. Perform the $w_i$ enclosure rule check on those non-virtual edges.
3. Create the virtual edge end keep out areas having the same size as the $w_i$ enclosure rule.
4. Flag any via overlapping a keep out area as violating the $w_i$ via enclosure rule.
5. Repeat the above steps for the next higher wide class objects.

The above generalized algorithm may also be performed for the $w_0$ objects, but since there are no virtual edges in $w_0$ objects, the algorithm may be computationally simplified to merely performing the $w_0$ enclosure rule check of the $w_0$ object edges.

For those verification tools which are not strong in edge operations, other algorithms may be used which accomplish the same result using generally only geometry operations. Referring now to FIGS. 12A–12F, the operation of another exemplary algorithm is depicted using geometry operations to perform the via enclosure check.

Figure 12A:
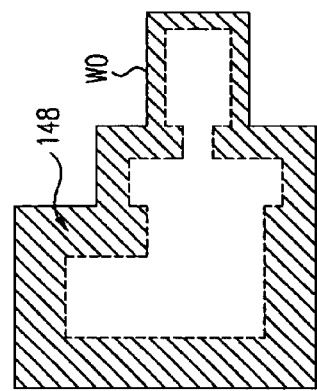
FIGS. 12A–12F are design layouts depicting vias placed within a metal geometry, and illustrate the operation and results of another exemplary via enclosure check algorithm.

In FIG. 12A, a $w_0$ object, and a wide class $w_1$ object derived from the $w_0$ object, are shown, along with a $w_1$ object virtual edge 141. This $w_0$ object is sized down by $W_0$OverVx to derive the object 140, thereby forming a $w_0$ violation region inside the $w_0$ object boundary but outside the sized down object 140 boundary. This $w_0$ violation region is also shown alone in FIG. 12D for clarity. The $w_0$ object is also sized down by $W_1$OverVx to derive the object 142, thereby forming a $w_1$ violation region inside the $w_1$ object boundary but outside the sized down object 142. These two $w_0$ and $w_1$ violation regions are merged to form a desired violation region, good through $w_1$ objects, which is labeled 147 in FIG. 12B.

Figure 12B:
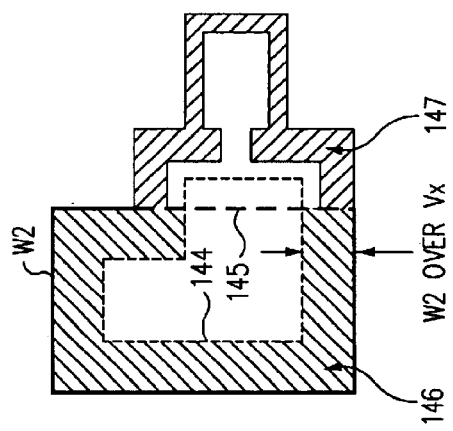
Figure 12C:
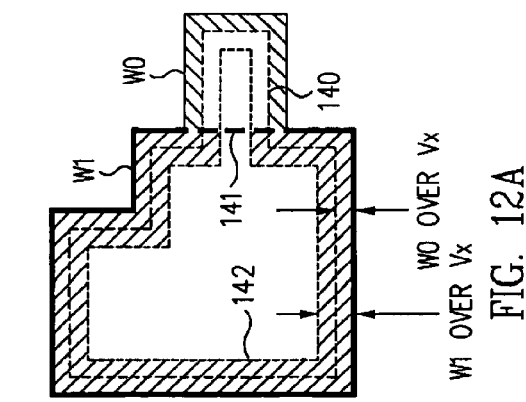
Figure 12D:
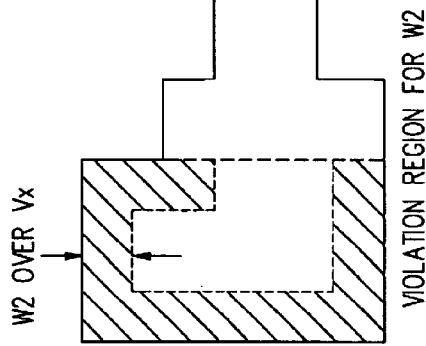
Figure 12E:
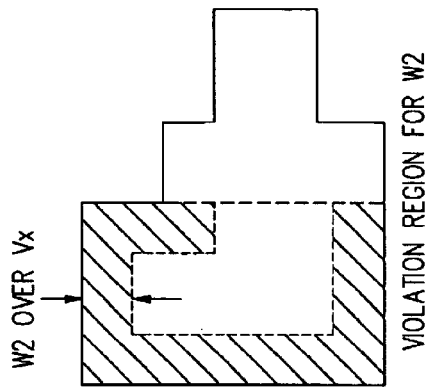
Figure 12F:
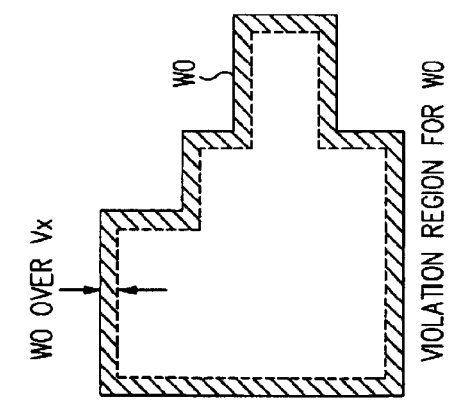

Also shown in FIG. 12B is a wide class $w_2$ object derived from the $w_0$ object, along with a $w_2$ object virtual edge 145. The $w_0$ object is also sized down by $W_2$OverVx to derive an object 144, thereby forming a $w_2$ violation region inside the $w_0$ object boundary but outside the sized down object 144 boundary. This $w_2$ violation region is also shown alone in FIG. 12F for clarity. This $w_2$ violation region is preferably merged with the earlier formed violation region 147 to form a desired violation region, good through $w_2$ objects, which is labeled 148 in FIG. 12C. As before, any via which encroaches this violation region is marked as a true via enclosure error.

Additional details of similar geometry-based techniques are described elsewhere herein.

Pure Fill Via Area Extraction in a Multi Wide Class Design

Electronic Design Automation (EDA) functions may be used to extract Pure Fill Via Areas (PFVA) for each metal layer. As used herein, a PFVA is an artificial object or geometry which has been pre-shrunk from the original geometry by the correct enclosure amount depending on whether the PFVA is within a wide metal area. A via can be dropped (i.e., placed) anywhere within such a PFVA without violating the respective via metal enclosure rules. A Layer Pure Fill Via Area (LPFVA) is an area which meets the metal enclosure rule for the specific metal layer. In other words, a via can be placed anywhere inside the area without violating the specific metal enclosure design rule for any wide class. A $v_x$ PFVA is the common area of a $mt_x$ LPFVA and a $mt_{x+1}$ LPFVA. In this common area, a $v_x$ via meets metal enclosure design rules for both metal layers $mt_x$ and $mt_{x+1}$ anywhere. A LPFVA may be used for filling vias into the area without violating a specific metal layer enclosure design rule. Similarly, a $v_x$ PFVA may be used for filling $v_x$ vias into the area without violating a specific metal layer enclosure design rule on either the $mt_x$ or $mt_{x+1}$ metal layers. Automated procedures to reliably extract the PFVA in a multi wide class design layout have been difficult to develop, and additional improvements are needed.

In general, for a multi wide class design, if there are n different wide classes with n different metal enclosure rules, we can define wide metal enclosure rules as $W_0$OverVia, $W_1$OverVia, ..., WnOverVia to be applied on wide metal sets $w_0$, $w_1$, ..., $w_n$, respectively.

To aid in understanding, the derivation of a PFVA for an arbitrary metal layer ($mt_x$) is used as an example to illustrate substantive differences between exemplary algorithms, which accommodate virtual boundaries of the wide objects, and traditional algorithms which typically treat the wide object as if it were a real geometry (having no virtual edges or vertices). In the examples that follow, three wide classes $w_0$, $w_1$, and $w_2$ are described, but the same (or equivalent) methods and techniques may be easily extended to additional wide classes.

For any of the algorithms that follow, the wide objects are typically first derived for each wide class object set, although they could alternatively be derived as the algorithm progresses. Exemplary DIVA code segments are described elsewhere herein which may be employed to derive the effective wide class object sets $w_0$, $w_1$, and $w_2$ for a metal layer $mt_x$. For the following algorithms, unless the context requires otherwise, a wide class object set may refer to both a wide class object set and/or an effective wide class object set.

FIGS. 13A–13C illustrate a traditional algorithm which sizes each wide class object as if it were a real geometry (having no virtual edges or vertices). Because the metal enclosure amounts are different for each wide class, the objects in each class should be sized or shrunk by a different amount. However, after sizing, virtual edges in the wide class objects also have been moved inwards, and consequently part of the PFVA might be lost by the operation. In addition, a fill area may be improperly separated into multiple areas where the wide class objects meet. For example, FIG. 13A shows a geometry 402, from which is derived a wide class $w_1$ object 404, shown in FIG. 13B. Also shown are two objects 406 which represent portions of the $w_0$ object which are outside of the $w_1$ objects. If each of the derived $w_1$ objects; and the "$w_0$ outside $w_1$" objects, are sized by its respective enclosure rule amount, the resulting areas 408 and 410 "pull apart" at the virtual boundaries of the $w_1$ object. It is preferred that these areas should instead be joined across the boundary.

Virtual edge techniques may be used to extract the PFVA's without separating them at virtual edges. Referring now to FIG. 13D, a geometry 412 (i.e., a $w_0$ object) is shown, along with an object 414 that represents the $w_0$ class object 412 after sizing down by $W_0$OverVia to get the PFVA for the $w_0$ class. This PFVA (object 414) may be assumed to now be the Current Pure Fill Via Area (CPFVA), which is now current as through the $w_0$ wide class objects.

FIG. 13E shows a derived wide class $w_i$ (0<=i<=n) object which has been sized (or shrunk) by the respective enclosure rule $W_i$OverVia to get the PFVA (labeled 416) for the $w_i$ class. This $w_i$ class PFVA 416 may be deducted from $w_i$ objects to get the $w_i$ class cutting areas 418, which are then deducted from the CPFVA 412. Preferably, however, only the real boundaries of the wide class $w_i$ objects should be shrunk, and the $w_i$ wide class virtual edges, which are inside the $w_0$ objects, should not have been shrunk. These areas may be added back to the CPFVA to properly account for the virtual edges, by first stretching the virtual edge segments of the $w_i$ objects by —$W_i$OverVia to derive stretched base edge segments (one of which is labeled 420). These segments are then sized inward, also by—$W_i$OverVia, to form $w_i$ virtual edge compensation areas (one of which is labeled 422), which may then be added to complete the CPFVA good through the $w_i$ layer (labeled as 424 in FIG. 13F). These virtual edge compensation areas are spaced a distance back from the ends of each virtual edge segment by the appropriate enclosure rule, and thus ensures that the via enclosure near corners of the $w_i$ objects has been properly accounted for.

In one embodiment, a method of extracting a PFVA using such edge operations may be described as follows:

1. Size down the $w_0$ objects by W0OverVia, to derive the CPFVA, which at this point is good for $w_0$ class objects.
2. Size down $w_i$ objects by WiOverVia (1<=i<=n), to derive the $w_i$ PFVA, then deducting the $w_i$ PFVA from the $w_i$ objects to form the $w_i$ cutting areas.
3. Stretch the $w_i$ virtual edges by –$W_i$OverVia to form the base edge segments for the $w_i$ compensation areas.
4. Size the base edge segments by –$W_i$Over Via to form $w_i$ virtual edge compensation areas.
5. Deduct the $w_i$ cutting areas from CPFVA and add the $w_i$ virtual edge compensation areas to the CPFVA. At this point the CPFVA is good for up through the $w_i$ objects.

As the above description implies, steps 2–5 are repeated for all classes $w_i$ up through $w_n$. At this point the $w_n$ CPFVA is good for up through the $w_n$ objects, and becomes the final PFVA for the layer. The actions recited in the above steps 2–5 may be performed in a variety of specific sequence orders, but the order described is exemplary. An exemplary DIVA coding which implements the above exemplary algorithm in generally the order described, for two classes of wide objects $w_1$ and $w_2$, is as follows:

21 v_area=geomSize(w_0-W0Overvia)
22 wv_edge=geomGetEdge(w1 inside w0)
23 wv_stch geomStretch(wv_edge-W1OverVia)
24 wv_stch_box=geomSize(wv_stch-W1OverVia)
25 wv_area=geomSize(w1-W1OverVia)
26 wv_cut=geomAndNot(w1 wv_area)

27 v_area=geomAndNot(v_area wv_cut)
28 v_area=geomOr(v_area wv_stch_box)
29 wv_edge=geomGetEdge(w2 inside w0)
30 wv_stch=geomStretch(wv_edge–W2OverVia)
31 wv_stch_box=geomSize(wv_stch–W2OverVia)
32 wv_area=geomSize(w2–W2OverVia)
33 wv_cut=geomAndNot(w2 wv_area)
34 v_area=geomAndNot(v_area wv_cut)
35 v_area=geomOr(v_area wv_stch_box)

In line 21, the CPFVA for the $w_0$ objects are derived, as exemplified by object 414 in FIG. 13D. In line 22 the $w_1$ object virtual edges are derived, and then stretched in line 23 to form the base edge segments 420. The $w_1$ virtual edge compensation areas 422 are formed in line 24 by sizing the base edge segments inward by the respective enclosure rule. The $w_1$ PFVA objects (such as object 416) are derived in line 25, and the $w_1$ cutting areas derived in line 26. The $w_1$ cutting areas (such as object 418) are deducted from the CPFVA in line 27, and the $w_1$ virtual edge compensation areas (such as object 422) added to the CPFVA in line 28.

As the above coding makes clear, the various steps of this algorithm may be performed in many different orders. For example, the cutting areas may be derived before the virtual edge compensation areas are derived, and the cutting areas may be deducted from the CPFVA before or after the virtual edge compensation areas are derived.

Figures 14A, 14B, 14C:
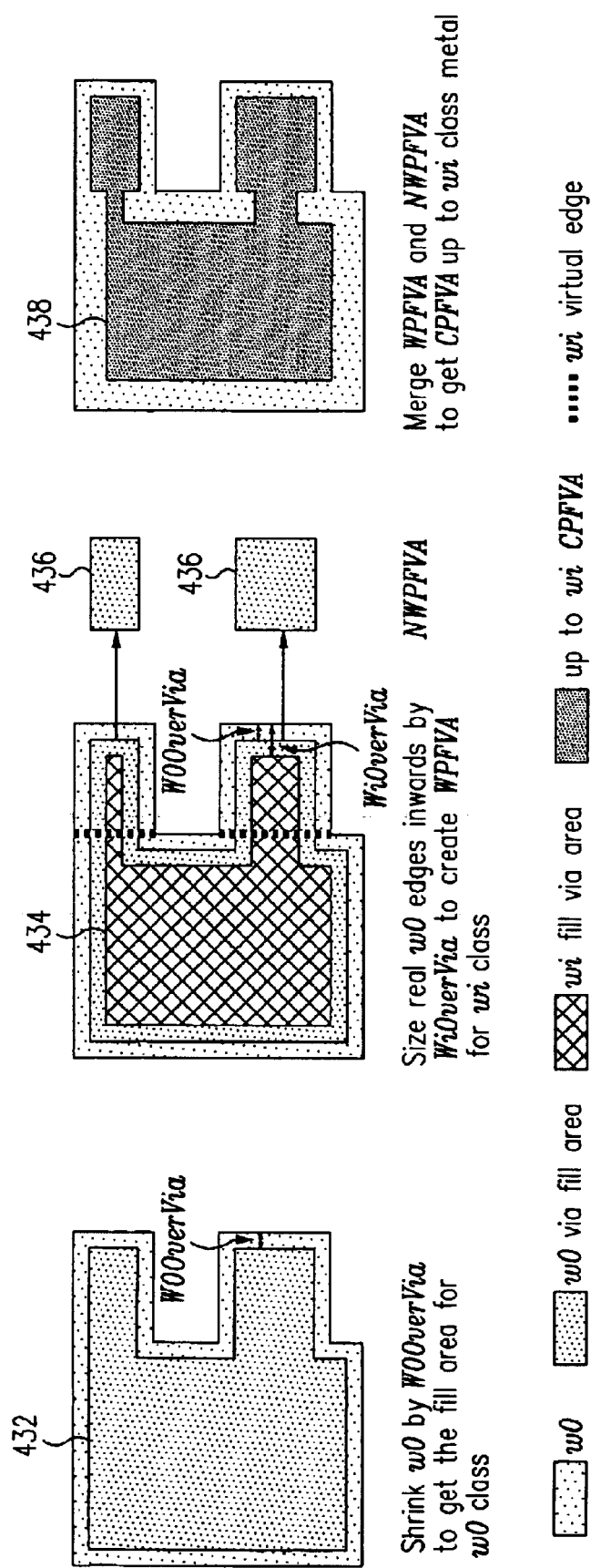
FIGS. 14A–14C are design layouts depicting a metal layer, and which illustrate another exemplary technique for deriving pure fill via areas within the metal layer.

The above algorithm uses edge operations advantageously to properly account for the virtual edges of the $w_i$ objects. For those EDA tools which are not strong in edge operations, other algorithms may be used which accomplish the same result using generally only geometry operations. Referring now to FIGS. 14A–14C, the operation of another exemplary algorithm is depicted using geometry operations to derive the PFVA.

In FIG. 14A, a $w_0$ object 431 is shown. This $w_0$ object is sized down by W0OverVia (i.e., sized by a negative amount –W0OverVia) to derive the CPFVA for the $w_0$ objects, labeled as object 432. In FIG. 14B, the $w_0$ object 431 is also sized down by $W_i$OverVia to derive a $W_1$ PFVA, labeled as object 434. The desired PFVA 438, shown in FIG. 14C, may be formed by merging the portion of the $w_0$ PFVA falling outside the $w_1$ objects (labeled 436) with those portions of the $W_1$ PFVA falling inside the $w_1$ objects. As before, the resultant PFVA properly accounts for the appropriate enclosure rule near the ends of $w_1$ virtual edge segments.

There are many geometric methods which may be utilized to perform such an algorithm. One such exemplary algorithm may be generalized for more than one wide object class as follows:

1. Size the $w_0$ objects by –$w_0$Over Via, to derive the CPFVA for the $w_0$ objects (e.g., object 432 in FIG. 14A).
2. For $w_i$ (1<=i<=n), size those $w_0$ geometries which contain $w_i$ objects by –$W_i$OverVia, to derive WiPFVA areas (e.g., $W_1$ PFVA object 434 in FIG. 14B).
3. Derive the non $w_i$ objects by deducting the $w_i$ objects from $w_0$ objects.
4. Get the current fill via area in the non $w_i$ objects by ANDING the non $w_i$ objects and the CPFVA. The result may be termed a N$W_i$PFVA to stand for Non-$W_i$ Pure Fill Via Area.
5. Merge the $W_i$PFVA and the N$W_i$PFVA to derive the CPFVA good through the $w_i$ layer (the $w_i$ CPFVA).
6. Repeat the above steps 2–5 for the next higher wide class. The final CPFVA is the resultant PFVA for all wide classes.

An exemplary DIVA coding of such an algorithm using geometry operations follows:
41 v_area=geomSize(w0–W0OverVia)
42 wv_area=geomSize(geomOverlap($w_0$ w1)–W1OverVia)
43 w_non=geomAndNot(w0 w1)
44 w0_area=geomAnd(v_area wv_non)
45 v_area=geomOr(wv_area w0_area)
46 wv_area=geomSize(geomOverlap(w0 w2)–W2OverVia)
47 wv_non=geomAndNot(w0 w2)
48 w1_area=geomAnd(v_area wv_non)
49 v_area=geomOr(wv_area w1_area)

In line 41, the CPFVA for the $w_0$ objects are derived (as exemplified by object 432). In line 42 the $w_0$ objects which contain a $w_1$ object are selected, and then sized down by W1OverVia to derive a $W_1$ PFVA (as exemplified by object 434). In line 43, the $w_0$ object portions lying outside the $w_1$ objects are derived, which are then ANDed with the CPFVA in line 44 to derive those portions of the CPFVA lying outside the $w_1$ objects (e.g., objects 436). Finally, in line 45 the $W_1$ PFVA is merged (ORed) with the CPFVA lying outside the $w_1$ objects to form the desired PFVA (e.g., object 438). It is unnecessary to discard the portion of the $W_1$ PFVA lying outside of the $w_1$ objects before this last merge operation because the CPFVA lying outside the $w_1$ objects is larger than the $W_1$ PFVA, and thus dictates the result.

Analogous lines 46–49 perform similar operations for the $w_2$ object class. In line 46 the $w_0$ objects which contain a $w_2$ object are selected, and then sized down by W2OverVia to derive the $W_2$ PFVA. In line 43, the $w_0$ object portions lying outside the $w_2$ objects are derived, which are then ANDed with the CPFVA in line 48 to derive those portions of the CPFVA lying outside the $w_2$ objects. Finally, in line 49 the $W_2$ PFVA is merged with the CPFVA lying outside the $w_2$ objects to form the desired PFVA. In other words, the desired PFVA is formed by merging the portion of the $w_1$ PFVA falling outside the $w_2$ objects with the $W_2$ PFVA. Alternatively, the desired PFVA may also be formed by merging the portion of the $w_1$ PFVA falling outside the $w_2$ objects with those portions of the $W_2$ PFVA falling inside the $w_2$ objects. Such a portion of the $W_2$ PFVA falling inside the $w_2$ objects may be termed as an effective $W_2$ PFVA. Such an effective PFVA may be viewed as being created by sizing the non-virtual boundary of the $w_2$ objects. The techniques described herein may be used to define such a function of sizing the real boundaries of an object if such a function is not available in the CAD tools of choice.

As we can see from the above examples, the operations are standard for each wide class, therefore they are easy to implement as design rule modules to be used for all metal layers and vias.

Correction of Pure Fill Via Area Spacing Violations in a Multi Wide Class Design After the PFVA is extracted for a given layer, via spacing violations may result relative to the existing vias or to another PFVA on the same layer. It is very desirable for such violations to be automatically removed.

An exemplary technique for automatically correcting such via spacing violations is depicted in FIGS. 15A–15F. Referring now to FIG. 15A, a $w_0$ object 461 is shown, along with the PFVA 462 for the $w_0$ object layer, and several existing vias 463, 464, 465, 466. Each of these vias is preferably sized outward by the appropriate via spacing rule to form respective via clearance areas 467, 468, 469, 470, shown in FIG. 15B. These via clearance areas are then deducted (i.e., "cut") from the PFVA 462 to form the resulting fill area 471 shown in FIG. 15C. Thus far, we have ensured that a via placed within the resulting fill area 471 will satisfy the via spacing rule relative to the existing vias, but as can be seen, the fill area 471 may not be wide enough to hold a via everywhere within its boundaries. Consequently, those portions narrower than the width of a via are next eliminated from the fill area 471. Preferably this is accomplished by sizing down, then sizing back up, each fill area 471 by an amount equal to just slightly less than one half the via width, as described elsewhere herein. The resulting fill areas 474, 475 are depicted in FIG. 15D, which shows the narrow portions 472, 473 (of width less than the VxWidth) as having been removed, and which results in two separate fill areas 474, 475.

The fill areas 474, 475 will hold a via placed anywhere within either one without violating the via spacing rule to an existing via. But since the two areas 474, 475 lie closer to each other than the via spacing rule near region 476, a via placed within area 474 may violate the via spacing rule relative to a via placed nearby within area 476. To correct such potential violations, a DRC check may be performed to identify all the PFVA's which violate the via spacing rule relative to another PFVA. In the exemplary FIG. 15D, both fill areas 474 and 475 would be selected by such a DRC check. Then, all the edges from each erroneous PFVA are selected. In addition, the edges forming convex vertices of the erroneous PFVA are also selected and stretched by an amount VxToVx, as shown in FIG. 15D, to cover corner to corner cases. Then, those edges and stretched edge segments are sized (outward) by VxToVx to form clearance areas for each PFVA, as shown in FIG. 15E. (The clearance area boundaries around fill area 474 and 475 are shown by dotted lines, except for the clearance areas formed by sizing the stretched edge segments from the convex vertices near region 476.) The clearance areas 477 are then deducted from the PFVA to form the via spacing violation free PFVA 480, 481, shown in FIG. 15F. Lastly, any slivers in these PFVA areas 480, 481 (which may have been created in these PFVA areas 480, 481 as a result of cutting the clearance areas) are removed, such as by preferably sizing down then sizing up by the appropriate amount. For example, if the edge 482 was shorter than the via width, such a sliver would be removed by this last operation. As some of these operations performed to correct certain violations may create other violations, such a method may be advantageously repeated until no errors remain.

A more generalized description of such a technique to make a PFVA "DRC-clean" to any existing via may be described as follows:

1. Identify existing vias which violate the via spacing rule with the PFVA's (either vias which are too close to a PFVA or which partially or fully overlap a PFVA).
2. Size the identified existing vias by VxToVx to form existing via clearance areas (e.g., FIG. 15B).
3. Cut the existing via clearance areas from the PFVA (e.g., FIG. 15C).
4. Size down and size up the remaining PFVA by VxWidth/2−TenthGrid to remove any slivers which are not big enough to hold a single via (e.g., FIG. 15D).

A more generalized description of a technique to clean the DRC violations among the PFVA's may be described as follows:

1. Find all the PFVA's which violate the via spacing rule by performing a DRC spacing check.
2. Select all the edges from the erroneous PFVA's.
3. Stretch the edges from convex vertices by VxToVx to cover corner to corner cases (e.g., stretched edge 478 shown in FIG. 15D).
4. Sizing those selected edges and stretched edge segments by VxToVx to form clearance areas for each PFVA (e.g., clearance areas 477 shown in FIG. 15E).
5. Cut the clearance areas from PFVA's to form PFVA's which meet the via spacing rule (e.g., FIG. 15F).
6. Size down and size up these "post-cut" PFVA's by VxWidth/2−TenthGrid to get rid of any slivers which are not big enough to hold a single via. This step may be optional depending upon the flow, because it might generate new spacing violations, but it will make the resultant PFVA easier to fill using an automated fill via process.
7. Repeat the process as long as there is a spacing violation between two PFVA's.

After this DRC violation correction, the remaining PFVA's are ready to fill with additional vias placed by a via fill process, which may be manual or performed by an automated design flow. In the exemplary technique described above, the EDA tool treats both erroneous geometries equally, and the cutting areas generated by the flow (e,g., see FIG. 15E) might result in a larger removed portion of the PFVA than absolutely necessary to meet the via spacing rule, but the benefits of achieving correction of such violations in an automatic flow is believed to more than compensate for such an over-sized correction.

An exemplary DIVA code module to implement this algorithm for a via layer $v_1$ may be implemented as follows:

61 v1=geomGetPurpose("V1" "drawing")
62 vbd=geomGetPurpose("V1" "boundary")
63 bad_v=drc(v1 vbd sep<V1ToV1 figa)
64 bad_v_cut=geomsize(bad_v V1ToV1)
65 vbd=geomAndNot(vbd bad_v_cut)
66 size_f=V1Width/2−TenthGrid
67 vbd=geomSize(geomSize(vbd−size_f) size_f)
68 bad_vbd=drc(vbd sep<V1ToV1 fig)
69 edge_ck=geomGetEdge(bad_vbd)
70 InEdge=geomCat(edge_ck)
71 BaseClass=geomCat(vbd)
72 StchSize=V1ToV1
73 load("convex_stch.rul")
74 edge_ck=geomOr(edge_ck edge_v_stch)
75 edge_ck_cut=geomSize(edge_ck V1ToV1)
76 vbd=geomAndNot(vbd edge_ck_cut)
77 size_f=V1Width/2−TenthGrid
78 vbd=geomSize(geomSize(vbd−size_f) size_f)

In lines 61–62 the vias of interest are assigned to a derived layer v1 and the PFVA is also assigned to a derived layer vbd. In line 63 the erroneous vias are identified, and then sized in line 64 by the via-to-via spacing V1ToV1, and the sized vias cut from the PFVA, thus redefining the VBD layer (e.g., see FIG. 15C). At lines 66–67, the slivers in the VBD layer are removed.

In line 68 a DRC check is performed to identify all PFVA's which violate the via spacing rule, and the edges of the erroneous PFVA's are selected (i.e., written to a derived layer edge_ck) in line 69. At lines 70–72 certain arguments are loaded in preparation for invoking (in line 73) the "convex stretch" code module (described above) which stretches the edge segments forming the convex vertices of the PFVA's (e.g., FIG. 15D) by an amount equal to the via spacing rule.

In lines 74–75 the stretched edge segments and the edge segments are both sized (i.e., outward) by the via spacing rule amount to form the PFVA cutting areas, which are then deducted from the PFVA's in line 76. Lastly, slivers in the resultant PFVA's narrower in width than a via are removed in lines 77–78.

The above technique may be likened to a correction of a spacing violation between objects of the same class, each having only non-virtual edges. In other words, a spacing violation between $w_0$ objects. A similar technique for correcting spacing violation between dummy (or other "non-design") geometries having potentially higher class objects defined by the non-design geometries includes stretching the non-virtual edges and vertices of each $w_i$ object to create cutting areas which are deducted from nearby geometries, and is described in co-pending U.S. application Ser. No. 10/201,044 filed Jul. 23, 2002, which application is hereby incorporated herein by reference.

General Comments

The use of a convenient set nomenclature such as "a plurality of wide class object sets $w_0, w_1, w_2, \ldots w_n$" need not imply that n must be greater than 2. Rather, n may be equal to 1, in which case there need be only one wide class of objects in addition to the original design geometries themselves, which are represented by the $w_0$ class. Moreover, n may alternatively be equal to 2 or more than 2. In the examples described, three wide classes $w_0$, $w_1$, and $w_2$ are described, but the same methods and techniques may be easily extended to additional wide classes.

As used herein, stretching an edge elongates the length of the edge while sizing an edge creates a rectangular area. Sizing is typically performed in the outward direction (i.e., "sizing up," or away from the center of the object), although at times may be toward the center of the object (i.e., "sizing down").

It should be appreciated that operations discussed herein may consist of directly entered commands by a computer system user, but the preferred embodiment includes steps executed by software modules. The functionality of step referred to herein may correspond to the functionality of modules or portions of modules. In addition to software modules, the above flows or portions of flows can be implemented as application instructions or menu items. For example, a sizing operation which only sizes non-virtual edges of an object by a sizing factor can be an application instruction provided by an EDA tool provider according to some embodiments of the present invention.

The operations referred to herein may be modules or portions of modules (e.g., software, firmware, or hardware modules). For example, the software modules discussed herein may include script, batch or other executable files, or combinations and/or portions of such files. The software modules may include a computer program or subroutines thereof encoded on computer-readable media.

Additionally, those skilled in the art will recognize that the boundaries between modules are merely illustrative and alternative embodiments may merge modules or impose an alternative decomposition of functionality of modules. For example, the modules discussed herein may be decomposed into sub-modules to be executed as multiple computer processes. Moreover, alternative embodiments may combine multiple instances of a particular module or sub-module. Furthermore, those skilled in the art will recognize that the operations described in exemplary embodiments are for illustration only. Operations may be combined or the functionality of the operations may be distributed in additional operations in accordance with the invention. Line numbers on exemplary code sections or modules are used to uniquely identify each line of code for ease of reference, and should not be taken to imply any particular required order between separately described modules, or necessarily even within a module.

Thus, the flows described herein, the operations thereof and modules therefore may be executed on a computer system configured to execute the operations of the flows and/or may be executed from computer-readable media. The flows may be embodied in a machine-readable and/or computer-readable medium for configuring a computer system to execute the flows. Thus, the software modules may be stored within and/or transmitted to a computer system memory to configure the computer system to perform the functions of the module.

The flows described herein can be applied to an entire design layout or portions thereof. For example, applying a flow to a smaller portion of a design layout can be performed to improve EDA tool performance, or as portions of the design layout are completed, or when only a portion of the design layout needs an increased density, or any other similar reason.

Although the above embodiments have been described in relation to Cadence EDA tools and code segments utilizing Diva language code, the techniques described herein can be applicable to and make use of any EDA tools, electronic circuit layout, and implemented in any code language. Moreover, although the above embodiments have been described in relation to integrated circuit layouts, the techniques described herein can be equally useful in the layout of other electronic devices, for example in a layout of a printed wiring board.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A method for deriving one or more pure fill via areas (PFVA) for geometries on a first layer in a design layout having multiple wide class objects on the first layer, said method comprising the steps of:

representing geometries on the first layer by a $w_0$ set of objects;

sizing the $w_0$ objects inward by an associated via enclosure rule $w_0 overVx$ to generate a PFVA for the $w_0$ objects ($w_0$ PFVA);

representing the $w_0$ PFVA as a current pure fill via area (CPFVA);

for each successive wide class of objects i=1, n corresponding to geometries on the first layer:

deriving the next higher numbered wide class object set $w_i$ corresponding to geometries on the first layer;

eliminating portions of the CPFVA lying inside the $w_i$ objects and lying within a distance equal to an associated via enclosure rule $w_i overV_x$ of any non-virtual boundary of the $w_i$ objects, to thereby form a resultant CPFVA valid for up to $w_i$ objects ($w_i$ CPFVA); and representing the $w_n$ CPFVA as the PFVA for the first layer.

2. The method as recited in claim 1 wherein n is equal to 1.

3. The method as recited in claim 1 wherein the first layer comprises a metal layer of an integrated circuit design layout.

4. The method as recited in claim 1 wherein the eliminating step to form the $w_i$ CPFVA comprises:

eliminating portions of the CPFVA lying inside the $w_i$ objects and inside a region of the $w_i$ object defined by its non-virtual boundaries and the end-most $w_i$overV$_x$ portions of its virtual boundaries, said regions extending inward therefrom by a distance equal to $w_i$overV$_x$.

5. The method as recited in claim 1 wherein the eliminating step to form the $w_i$ CPFVA comprises the steps of:

deriving portions of the CPFVA lying outside the $w_i$ objects as a non-$w_i$ PFVA;

deriving an effective PFVA for the $w_i$ objects ($w_i$ EPFVA); and merging the is $w_i$ EPFVA with the non-$w_i$ PFVA to generate the $w_i$ CPFVA.

6. The method as recited in claim 5 wherein the non-$w_i$ PFVA deriving step comprises:

deducting $w_i$ objects from the $w_0$ objects to generate non-$w_i$ objects; and ANDing the non-$w_i$ objects with the CPFVA.

7. The method as recited in claim 5 wherein the $w_i$ EPFVA deriving step comprises:

sizing the $w_0$ objects inward by $w_i$overV$_x$; and keeping portions of the sized $w_0$ objects which fail within the $w_i$ objects to form the $w_i$ EPFVA.

8. The method as recited In claim 7 wherein the step of sizing the $w_0$ objects inward by $w_i$overV$_x$ comprises:

sizing only those is $w_0$ objects which contain a $w_i$ object.

9. The method as recited in claim 1 wherein the eliminating step to form the $w_i$ CPFVA comprises:

sizing the $w_i$ objects inward by an associated via enclosure rule $w_i$overV$_x$ to generate a PFVA for the $w_i$ objects ($w_i$ PFVA);

removing portions of the CPFVA which fall inside the $w_i$ object but outside the $w_i$ PFVA;

adding $w_i$ virtual edge compensation areas to the CPFVA.

10. The method as recited in claim 9 wherein the virtual edge compensation areas are formed by shrinking each $w_i$ object virtual edge by $w_i$overV$_x$ to generate a base edge, and then sizing each base edge inward by $w_i$overV$_x$.

11. The method as recited in claim 9 wherein the removing step comprises:

deducting the $w_i$ PFVA from the $w_i$ objects to generate $w_i$ cutting areas; and deducting the $w_i$ cutting areas from the CPFVA.

12. A method of making a computer readable media product that encodes a design file representation of a design layout of an electronic circuit, said design layout having multiple wide class objects on the first layer, said method comprising the steps of:

representing geometries on the first layer by a $w_0$ set of objects;

sizing the $w_0$ objects inward by an associated via enclosure rule $w_0$overV$_x$ to generate pure fill via areas (PFVA) for the $w_0$ objects ($w_0$ PFVA);

representing the $w_0$ PFVA as a current pure fill via area (CPFVA);

for each successive wide class of objects i=1, n corresponding to geometries on the first layer:

deriving the next higher numbered wide class object set $w_i$ corresponding to geometries on the first layer;

eliminating portions of the CPFVA lying inside the $w_i$ objects and lying within a distance equal to an associated via enclosure rule $w_i$overV$_x$ of any non-virtual boundary of the $w_i$ objects, to thereby form a resultant CPFVA valid for up to $w_i$ objects ($w_i$ CPFVA);

representing the $w_n$ CPFVA as the PFVA for the first layer; and using the PFVA for the first layer to indicate where vias may be placed.

13. The method as recited in claim 12 wherein n is equal to 1.

14. The method as recited in claim 12 wherein the first layer comprises a metal layer of an integrated circuit design layout.

15. The method as recited in claim 12 wherein the eliminating step to form the $w_i$ CPFVA comprises:

eliminating portions of the CPFVA lying inside the $w_i$ objects and inside a region of the $w_i$ object defined by its non-virtual boundaries and the end-most $w_i$overV$_x$ portions of its virtual boundaries, said regions extending inward therefrom by a distance equal to $w_i$overV$_x$.

16. The method as recited in claim 12 wherein the computer readable media product is embodied as one or more media selected from the set of a disk, tape, or other magnetic, optical, semiconductor or electronic storage medium and a network, wire line, wireless of other communications medium.

17. A method of processing one or more design files for an electronic circuit, the one or more design files encoding representations of a design layout of the electronic circuit, the design layout having multiple wide class objects on a first layer, said method comprising the steps of:

representing geometries on the first layer by a $w_0$ set of objects;

sizing the $w_0$ objects inward by an associated via enclosure rule $w_0$overV$_x$ to generate pure fill via areas (PFVA) for the $w_0$ objects ($w_0$ PFVA);

representing the $w_0$ PFVA as a current pure fill via area (CPFVA);

for each successive wide class of objects i=1, n corresponding to geometries on the first layer:

deriving the next higher numbered wide class object set $w_i$ corresponding to geometries on the first layer;

eliminating portions of the CPFVA lying inside the $w_i$ objects and lying within a distance equal to an associated via enclosure rule $w_i$overV$_x$ of any non-virtual boundary of the $w_i$ objects, to thereby form a resultant CPFVA valid for up to $w_i$ objects ($w_i$ CPFVA); and representing the $w_n$ CPFVA as the PFVA for the first layer.

18. The method as recited in claim 17 wherein n is equal to 1.

19. The method as recited in claim 17 wherein the first layer comprises a metal layer of an integrated circuit design layout.

20. The method as recited In claim 17 wherein the eliminating step to form the $w_1$ CPFVA comprises:

eliminating portions of the CPFVA lying inside the $w_i$ objects and inside a region of the $w_i$ object defined by its non-virtual boundaries and the end-most $w_i$overV$_x$ portions of its virtual boundaries, said regions extending inward therefrom by a distance equal to $w_i$overV$_x$.

21. An electronic circuit fabricated from a design layout representation thereof, said design layout being generated by the steps of:

representing geometries on the first layer by a $w_0$ set of objects;

sizing the $w_0$ objects inward by an associated via enclosure rule $w_0$overV$_x$ to generate pure fill via areas (PFVA) for the $w_0$ objects ($w_0$ PFVA);

representing the $w_0$ PFVA as a current pure fill via area (CPFVA);

for each successive wide class of objects i=1, n corresponding to geometries on the first layer:

deriving the next higher numbered wide class object set $w_i$ corresponding to geometries on the first layer;

eliminating portions of the CPFVA lying inside the $w_i$ objects and lying within a distance equal to an associated via enclosure rule $w_i$overV$_x$ of any non-virtual boundary of the $w_i$ objects, to thereby form a resultant CPFVA valid for up to $w_i$ objects ($w_i$ CPFVA);

representing the $w_n$ CPFVA as the PFVA for the first layer; and using the PFVA for the first layer to indicate where vias may be placed.

22. The electronic circuit as recited in claim 21 wherein n is equal to 1.

23. The electronic circuit as recited in claim 21 wherein the first layer represents a metal layer of an integrated circuit design layout.

24. The electronic circuit as recited in claim 21 wherein the eliminating step of the steps for generating the design layout comprises the step of:

eliminating portions of the CPFVA lying inside the $w_i$ objects and inside a region of the $w_i$ object defined by its non-virtual boundaries and the end-most $w_i$overV$_x$ portions of its virtual boundaries, said regions extending inward therefrom by a distance equal to $w_i$overV$_x$.

25. A computer readable encoding of an electronic circuit design, the computer readable encoding comprising:

one or more design file media encoding representations of a multiple wide object class design layout having geometries on a first layer;

wherein the computer readable encoding of the electronic circuit design was generated by the steps of:

representing geometries on the first layer by a $w_0$ set of objects;

sizing the $w_0$ objects inward by an associated via enclosure rule $w_0$overV$_x$ to generate pure fill via areas (PFVA) for the $w_0$ objects ($w_0$ PFVA);

representing the $w_0$ PFVA as a current pure fill via area (CPFVA);

for each successive wide class of objects i=1, n corresponding to geometries on the first layer:

deriving the next higher numbered wide class object set $w_i$ corresponding to geometries on the first layer;

eliminating portions of the CPFVA lying inside the $w_i$ objects and lying within a distance equal to an associated via enclosure rule $w_i$overV$_x$ of any non-virtual boundary of the $w_i$ objects, to thereby form a resultant CPFVA valid for up to $w_i$ objects ($w_i$ CPFVA); and representing the $w_n$ CPFVA as the PFVA for the first layer.

26. The computer readable encoding as recited in claim 25 wherein n is equal to 1.

27. The computer readable encoding as recited in claim 25 wherein the first layer comprises a metal layer of an integrated circuit design layout.

28. The computer readable encoding as recited in claim 25 wherein the steps for generating the computer readable encoding of the electronic circuit design further comprise:

eliminating portions of the CPFVA lying inside the $w_i$ objects and inside a region of the $w_i$ object defined by its non-virtual boundaries and the end-most $w_i$overV$_x$ portions of its virtual boundaries, said regions extending inward therefrom by a distance equal to $w_i$overV$_x$, to form the $w_i$ CPFVA.

29. An apparatus for processing one or more design files for an electronic circuit, the one or more design files encoding representations of a design layout of the electronic circuit, said apparatus comprising:

means for representing geometries on the first layer by a $w_0$ set of objects;

means for sizing the $w_0$ objects inward by an associated via enclosure rule $w_0$overV$_x$ to generate pure fill via areas (PFVA) for the $w_0$ objects ($w_0$ PFVA);

means for representing the $w_0$ PFVA as a current pure fill via area (CPFVA);

means for deriving the next higher numbered wide class object set $w_i$ corresponding to geometries on the first layer; for each successive wide class of objects i=1, n corresponding to geometries on the first layer:

means for eliminating portions of the CPFVA lying inside the $w_i$ objects and lying within a distance equal to an associated via enclosure rule $w_i$overV$_x$ of any non-virtual boundary of the $w_i$ objects, to thereby form a resultant CPFVA valid for up to $w_i$ objects ($w_i$ CPFVA); and means for representing the $w_n$ CPFVA as the PFVA for the first layer.

30. The apparatus as recited in claim 29 wherein n is equal to 1.

31. The apparatus as recited in claim 29 wherein the means for eliminating comprises:

means for eliminating portions of the CPFVA lying inside the $w_i$ objects and inside a region of the $w_i$ object defined by its non-virtual boundaries and the end-most $w_i$overV$_x$ portions of its virtual boundaries, said regions extending inward therefrom by a distance equal to $w_i$overV$_x$.

32. A computer readable encoding of instructions for a computer, said instructions encoding a method for use with a design layout, said encoded method for deriving one or more pure fill via areas (PFVA) for geometries on a first layer in a design layout having multiple wide class objects on the first layer, said encoded method comprising the steps of:

representing geometries on the first layer by a $w_0$ set of objects;

sizing the $w_0$ objects inward by an associated via enclosure rule $w_0$overV$_x$ to generate a PFVA for the $w_0$ objects ($w_0$ PFVA);

representing the $w_i$ PFVA as a current pure fill via area (CPFVA);

for each successive wide class of objects i=1, n corresponding to geometries on the first layer:

deriving the next higher numbered wide class object set $w_i$ corresponding to geometries on the first layer;

eliminating portions of the CPFVA lying inside the $w_i$ objects and lying within a distance equal to an associated via enclosure rule $w_i$overV$_x$ of any non-virtual boundary of the $w_i$ objects, to thereby form a resultant CPFVA valid for up to $w_i$ objects ($w_i$ CPFVA); and representing the $w_i$ CPFVA as the PFVA for the first layer.

* * * * *

UNITED STATES PATENT AND TRADEMARK OFFICE
CERTIFICATE OF CORRECTION

PATENT NO.   : 6,832,360 B2
DATED        : December 14, 2004
INVENTOR(S)  : Mu-Jing Li It is certified that error appears in the above-identified patent and that said Letters Patent is hereby corrected as shown below:

Column 3,
Lines 63 and 64, the words "to $w_l$ objects ($w_l$ CPFVA)" should read -- to $w_i$ objects ($w_i$ CPFVA) --.

Column 6,
Line 36, the words "a wide class $w_l$" should read — a wide class $w_i$ --.

Column 8,
Line 67, the words "in $w_i$ can pass the $wide_i$ test" should read -- in $w_l$ can pass the $wide_l$ test --.

Column 9,
Line 30, the words "on the initial $w_l$ set" should read -- on the initial $w_i$ set --.
Line 58, the words "size_f=Mtwidel/2-TenthGrid" should read -- size_f=MtWidel/2-TenthGrid --.
Line 61, the words "$non_{13}$ w1=geomAndNot(geomOverlap(w0 w1) w1)" should read -- non_ w1=geomAndNot(geomOverlap(w0 w1) w1) --.

Column 10,
Line 53, the words "$\mu$for" should read -- $\mu$ for -- .

Column 11,
Line 20, the words "corner-corner" should read -- corner-to-corner --.

Column 13,
Line 30, the word "Sqaure" should read -- Square --.

Column 14,
Line 59, the words "class object $w_l$ is checked" should read -- class object $w_i$ is checked --.

Column 15,
Line 23, the words "$w_l$ edges" should read -- $w_i$ edges --.
Line 51, the words "(error_box $mes_{13}$ err)" should read -- (error_box mes_err) --
Line 56, the words "the $w_l$ object" should read -- the $w_i$ object --.

Column 18,
Line 16, the words "the $w_l$ object" should read -- the wi object --.
Line 18, the words "object $w_l$ edge" should read -- object wl edge --.

UNITED STATES PATENT AND TRADEMARK OFFICE
CERTIFICATE OF CORRECTION

PATENT NO. : 6,832,360 B2
DATED : December 14, 2004
INVENTOR(S) : Mu-Jing Li

It is certified that error appears in the above-identified patent and that said Letters Patent is hereby corrected as shown below:

Column 21,
Line 33, the words "$W_n$OverVia,..., WnOverVia" should read -- $W_i$OverVia,..., $W_n$OverVia --.

Column 22,
Line 15, the words "wide class $w_l$ (0<i<=n) object" should read -- wide class $w_i$ (0<i<=n) object --.
Line 18, the words "This $w_l$ class" should read -- This $w_i$ class --.
Line 19, the words "get the $w_l$ class" should read -- $w_i$ class --.
Line 22, the words "and the $w_l$ class" should read -- and the $w_i$ class --.
Line 39, the words "objects by W0OverVia, to" should read -- objects by $W_0$OverVia, to --.
Line 41, the words "$w_l$ objects by WiOverVia" should read -- $w_i$ objects by $W_i$OverVia --.
Line 42, the words "derive the $w_l$ PFVA, then deducting the $w_l$ PFVA" should read -- derive the $w_i$ PFVA , then deducting the $w_i$ PFVA --.
Line 43, the words "form the $w_l$ cutting" should read -- form the $w_i$ cutting --.
Line 44, the words "the $w_l$ virtual edges" should read -- the $w_i$ virtual edges --.
Line 46, the words "by –$W_i$Over Via to" should read -- by –$W_i$OverVia to --.
Line 49, the words "$w_l$ virtual edge" should read – $w_i$ virtual edge --.
Line 50, the words "through the $w_l$" should read -- through the $w_i$ --.
Line 53, the words "classes $w_l$ up through" should read – classes $w_i$ up through --.
Line 61, the words "v_area=geomSize(wr$W_0$–vervia)" should read -- v_area-geomSize(w0–W0OverVia) --.

Column 23,
Line 36, the words "W0OverVia" should read – $W_0$OverVia --.
Line 37, the words "–W0OverVia" should read ---$W_0$OverVia --.
Line 39, the words "sized down by $W_1$OverVia to derive a $W_l$ PFVA," should read -- sized down by $W_l$OverVia to derive a $W_l$PFVA,
Line 43, the words "the $W_l$ PFVA" should read -- the $W_l$PFVA --.
Line 50, the words "by–$W_0$Over Via, to" should read -- by–$W_0$OverVia, to --.
Line 53, the words "For $w_l$ (1<=i<=n)," should read -- For $w_i$ (1<=i<=n), --.
Line 54, the words "contain $w_l$ objects by –$W_i$OverVia, to derive WiPFVA" should read -- contain $w_i$ objects by $W_i$OverVia, to derive $W_i$PFVA --.
Line 55, the words "$W_l$ PFVA" should read -- $W_i$PFVA --.
Line 62, the words "the $W_l$PFVA and the $NW_l$PFVA" should read -- the $W_i$PFVA and the $NW_i$PFVA --.
Line 63, the words "(the $w_l$ CPFVA)" should read -- (the $w_i$ CPFVA) --.

UNITED STATES PATENT AND TRADEMARK OFFICE
CERTIFICATE OF CORRECTION

PATENT NO. : 6,832,360 B2
DATED : December 14, 2004
INVENTOR(S) : Mu-Jing Li

It is certified that error appears in the above-identified patent and that said Letters Patent is hereby corrected as shown below:

Column 24,
Line 6, the words "w_non=geomAndNot(w0 w1)" should read -- wv_non=geomAndNot(w0 w1) --.
Line 17, the words "W1OverVia to derive a $W_1$ PFVA" should read -- $W_1$ OverV ia to derive a $W_1$PFVA --.
Lines 22, 24 and 27, the words "$W_1$ PFVA" should read -- $W_1$PFVA --.
Line 30, the words "W2OverVia to" should read -- $W_2$OverVia to --.
Lines 31, 35 and 38, the words "$W_2$ PFVA" should read -- $W_2$PFVA --.

Column 27,
Line 20, the words "Moreover. n may" should read -- Moreover, n may --.

Column 28,
Line 18, the words "Diva" should read -- DIVA --.

Column 29,
Line 27, the word "fail" should read -- fall --.
Line 30, the words "In claim 7" should read -- in claim 7 --.

Column 30,
Line 23, the words "wireless of" should read -- wireless or --.
Line 53, the words "In claim 17" should read -- in claim 17 --.

Column 32,
Line 52, the words "$w_i$ PFVA" should read -- $w_0$ PFVA --.
Line 64, the words "$w_i$ CPFVA" should read -- $w_n$ CPFVA --.

Signed and Sealed this

Thirty-first Day of May, 2005

JON W. DUDAS
*Director of the United States Patent and Trademark Office*

UNITED STATES PATENT AND TRADEMARK OFFICE
CERTIFICATE OF CORRECTION

PATENT NO. : 6,832,360 B2
DATED : December 14, 2004
INVENTOR(S) : Mu-Jing Li

It is certified that error appears in the above-identified patent and that said Letters Patent is hereby corrected as shown below:

Column 3,
Lines 63 and 64, the words "to $w_l$ objects ($w_l$ CPFVA)" should read -- to $w_i$ objects ($w_i$ CPFVA) --.

Column 6,
Line 36, the words "a wide class $w_l$" should read -- a wide class $w_i$ --.

Column 8,
Line 67, the words "in $w_i$ can pass the $wide_i$ test" should read -- in $w_l$ can pass the $wide_l$ test --.

Column 9,
Line 30, the words "on the initial $w_l$ set" should read -- on the initial $w_i$ set --.
Line 58, the words "size_f=Mtwidel/2-TenthGrid" should read -- size_f=MtWidel/2-TenthGrid --.
Line 61, the words "$non_{13}$ w1=geomAndNot(geomOverlap(w0 w1) w1)" should read -- non_ w1=geomAndNot(geomOverlap(w0 w1) w1) --.

Column 10,
Line 53, the words "$\mu$ for" should read -- $\mu$ for -- .

Column 11,
Line 20, the words "corner-corner" should read -- corner-to-corner --.

Column 13,
Line 30, the word "Sqaure" should read -- Square --.

Column 14,
Line 59, the words "class object $w_l$ is checked" should read -- class object $w_i$ is checked --.

Column 15,
Line 23, the words "$w_l$ edges" should read -- $w_i$ edges --.
Line 51, the words "(error_box $mes_{13}$ err)" should read -- (error_box mes_err) --
Line 56, the words "the $w_l$ object" should read -- the $w_i$ object --.

Column 18,
Line 16, the words "the $w_l$ object" should read -- the wl object --.
Line 18, the words "object $w_l$ edge" should read -- object wl edge --.

Column 21,
Line 33, the words "$W_1$OverVia,..., WnOverVia" should read -- $W_1$OverVia,..., $W_n$Over-Via --.

UNITED STATES PATENT AND TRADEMARK OFFICE
CERTIFICATE OF CORRECTION

PATENT NO. : 6,832,360 B2
DATED : December 14, 2004
INVENTOR(S) : Mu-Jing Li

It is certified that error appears in the above-identified patent and that said Letters Patent is hereby corrected as shown below:

Column 22,
Line 15, the words "wide class $w_l$ (0<i<=n) object" should read -- wide class $w_i$ (0<i<=n) object --.
Line 18, the words "This $w_l$ class" should read -- This $w_i$ class --.
Line 19, the words "get the $w_l$ class" should read -- $w_i$ class --.
Line 22, the words "and the $w_l$ class" should read -- and the $w_i$ class --.
Line 39, the words "objects by W0OverVia, to" should read -- objects by $W_0$OverVia, to --.
Line 41, the words "$w_l$ objects by WiOverVia" should read -- $w_i$ objects by $W_i$OverVia --.
Line 42, the words "derive the $w_l$ PFVA, then deducting the $w_l$ PFVA" should read -- derive the $w_i$ PFVA , then deducting the $w_i$ PFVA --.
Line 43, the words "form the $w_l$ cutting" should read -- form the $w_i$ cutting --.
Line 44, the words "the $w_l$ virtual edges" should read -- the $w_i$ virtual edges --.
Line 46, the words "by –$W_i$Over Via to" should read -- by –$W_i$OverVia to --.
Line 49, the words "$w_l$ virtual edge" should read – $w_i$ virtual edge --.
Line 50, the words "through the $w_l$" should read -- through the $w_i$ --.
Line 53, the words "classes $w_l$ up through" should read – classes $w_i$ up through --.
Line 61, the words "v_area=geomSize(w0–W0OverVia)" should read -- v_area-geomSize(w0–W0OverVia) --.

Column 23,
Line 36, the words "W0OverVia" should read -- $W_0$OverVia --.
Line 37, the words "–W0OverVia" should read -- -$W_0$OverVia --.
Line 39, the words "sized down by $W_1$OverVia to derive a $W_1$ PFVA," should read -- sized down by $W_1$OverVia to derive a $W_1$PFVA,
Line 43, the words "the $W_1$ PFVA" should read -- the $W_1$PFVA --.
Line 50, the words "by –$W_0$Over Via, to" should read -- by –$W_0$OverVia, to --.
Line 53, the words "For $w_l$ (1<=i<=n)," should read -- For $w_i$ (1<=i<=n), --.
Line 54, the words "contain $w_l$ objects by –$W_i$OverVia, to derive WiPFVA" should read -- contain $w_i$ objects by -$W_i$OverVia, to derive $W_i$PFVA --.
Line 55, the words "$W_1$ PFVA" should read -- $W_i$PFVA --.
Line 62, the words "the $W_1$PFVA and the $NW_1$PFVA" should read -- the $W_i$PFVA and the $NW_i$PFVA --.
Line 63, the words "(the $w_l$ CPFVA)" should read -- (the $w_i$ CPFVA) --.

Column 24,
Line 6, the words "w_non=geomAndNot(w0 w1)" should read -- wv_non=geomAndNot(w0 w1) --.
Line 17, the words "W1OverVia to derive a $W_1$ PFVA" should read -- $W_1$OverVia to derive a $W_1$PFVA --.
Lines 22, 24 and 27, the words "$W_1$ PFVA" should read -- $W_1$PFVA --.

UNITED STATES PATENT AND TRADEMARK OFFICE
CERTIFICATE OF CORRECTION

PATENT NO.   : 6,832,360 B2
DATED        : December 14, 2004
INVENTOR(S)  : Mu-Jing Li It is certified that error appears in the above-identified patent and that said Letters Patent is hereby corrected as shown below:

<u>Column 24 (cont'd),</u>
Line 30, the words "W2OverVia to" should read -- $W_2OverVia$ to --.
Lines 31, 35 and 38, the words "$W_2$ PFVA" should read -- $W_2PFVA$ --.

<u>Column 27,</u>
Line 20, the words "Moreover. n may" should read -- Moreover, n may --.

<u>Column 28,</u>
Line 18, the words "Diva" should read -- DIVA --.

<u>Column 29,</u>
Line 27, the word "fail" should read -- fall --.
Line 30, the words "In claim 7" should read -- in claim 7 --.

<u>Column 30,</u>
Line 23, the words "wireless of" should read -- wireless or --.
Line 53, the words "In claim 17" should read -- in claim 17 --.

<u>Column 32,</u>
Line 52, the words "$w_i$ PFVA" should read -- $w_0$ PFVA --.
Line 64, the words "$w_i$ CPFVA" should read -- $w_n$ CPFVA --.

This certificate supersedes Certificate of Correction issued May 31, 2005.

Signed and Sealed this

Twenty-third Day of August, 2005

JON W. DUDAS
*Director of the United States Patent and Trademark Office*

UNITED STATES PATENT AND TRADEMARK OFFICE
CERTIFICATE OF CORRECTION

PATENT NO.   : 6,832,360 B2
DATED        : December 14, 2004
INVENTOR(S)  : Mu-Jing Li It is certified that error appears in the above-identified patent and that said Letters Patent is hereby corrected as shown below:

Column 3,
Lines 63 and 64, the words "to $w_1$ objects ($w_1$ CPFVA)" should read -- to $w_i$ objects ($w_i$ CPFVA) --.

Column 6,
Line 36, the words "a wide class $w_1$" should read -- a wide class $w_i$ --.

Column 8,
Line 67, the words "in $w_i$ can pass the wide$_i$ test" should read -- in $w_1$ can pass the wide$_1$ test --.

Column 9,
Line 30, the words "on the initial $w_1$ set" should read -- on the initial $w_i$ set --.
Line 58, the words "size_f=Mtwidel/2-TenthGrid" should read -- size_f=MtWidel/2-TenthGrid --.
Line 61, the words "non$_{13}$ w1=geomAndNot(geomOverlap(w0 w1) w1)" should read -- non_ w1=geomAndNot(geomOverlap(w0 w1) w1) --.

Column 10,
Line 53, the words "$\mu$for" should read -- $\mu$ for -- .

Column 11,
Line 20, the words "corner-corner" should read -- corner-to-corner --.

Column 13,
Line 30, the word "Sqaure" should read -- Square --.

Column 14,
Line 59, the words "class object $w_1$ is checked" should read -- class object $w_i$ is checked --.

Column 15,
Line 23, the words "$w_1$ edges" should read -- $w_i$ edges --.
Line 51, the words "(error_box mes$_{13}$ err)" should read -- (error_box mes_err) --
Line 56, the words "the $w_1$ object" should read -- the $w_i$ object --.

Column 18,
Line 16, the words "the $w_1$ object" should read -- the wl object --.
Line 18, the words "object $w_1$ edge" should read -- object wl edge --.

Column 21,
Line 33, the words "W$_1$OverVia,..., WnOverVia" should read -- W$_1$OverVia,..., W$_n$Over-Via --.

UNITED STATES PATENT AND TRADEMARK OFFICE
CERTIFICATE OF CORRECTION

PATENT NO. : 6,832,360 B2
DATED : December 14, 2004
INVENTOR(S) : Mu-Jing Li

It is certified that error appears in the above-identified patent and that said Letters Patent is hereby corrected as shown below:

Column 22,
Line 15, the words "wide class $w_l$ (0<i<=n) object" should read -- wide class $w_i$ (0<i<=n) object --.
Line 18, the words "This $w_l$ class" should read -- This $w_i$ class --.
Line 19, the words "get the $w_l$ class" should read -- $w_i$ class --.
Line 22, the words "and the $w_l$ class" should read -- and the $w_i$ class --.
Line 39, the words "objects by W0OverVia, to" should read -- objects by $W_0$OverVia, to --.
Line 41, the words "$w_l$ objects by WiOverVia" should read -- $w_i$ objects by $W_i$OverVia --.
Line 42, the words "derive the $w_l$ PFVA, then deducting the $w_l$ PFVA" should read -- derive the $w_i$ PFVA , then deducting the $w_i$ PFVA --.
Line 43, the words "form the $w_l$ cutting" should read -- form the $w_i$ cutting --.
Line 44, the words "the $w_l$ virtual edges" should read -- the $w_i$ virtual edges --.
Line 46, the words "by $-W_i$Over Via to" should read -- by $-W_i$OverVia to --.
Line 49, the words "$w_l$ virtual edge" should read – $w_i$ virtual edge --.
Line 50, the words "through the $w_l$" should read -- through the $w_i$ --.
Line 53, the words "classes $w_l$ up through" should read – classes $w_i$ up through --.
Line 61, the words "v_area=geomSize($w_O$–W0OverVia)" should read -- v_area-geomSize(w0–W0OverVia) --.

Column 23,
Line 36, the words "W0OverVia" should read -- $W_0$OverVia --.
Line 37, the words "–W0OverVia" should read -- -$W_0$OverVia --.
Line 39, the words "sized down by $W_1$OverVia to derive a $W_1$ PFVA," should read -- sized down by $W_1$OverVia to derive a $W_1$PFVA,
Line 43, the words "the $W_1$ PFVA" should read -- the $W_1$PFVA --.
Line 50, the words "by –$W_0$Over Via, to" should read -- by –$W_0$OverVia, to --.
Line 53, the words "For $w_l$ (1<=i<=n)," should read -- For $w_i$ (1<=i<=n), --.
Line 54, the words "contain $w_l$ objects by –$W_l$OverVia, to derive WiPFVA" should read -- contain $w_i$ objects by -$W_i$OverVia, to derive $W_i$PFVA --.
Line 55, the words "$W_1$ PFVA" should read -- $W_i$PFVA --.
Line 62, the words "the $W_l$PFVA and the $NW_l$PFVA" should read -- the $W_i$PFVA and the $NW_i$PFVA --.
Line 63, the words "(the $w_l$ CPFVA)" should read -- (the $w_i$ CPFVA) --.

Column 24,
Line 6, the words "w_non=geomAndNot(w0 w1)" should read -- wv_non=geomAndNot (w0 w1) --.
Line 17, the words "W1OverVia to derive a $W_1$ PFVA" should read -- $W_1$OverVia to derive a $W_1$PFVA --.
Lines 22, 24 and 27, the words "$W_1$ PFVA" should read -- $W_l$PFVA --.

UNITED STATES PATENT AND TRADEMARK OFFICE
CERTIFICATE OF CORRECTION

PATENT NO. : 6,832,360 B2
DATED : December 14, 2004
INVENTOR(S) : Mu-Jing Li

It is certified that error appears in the above-identified patent and that said Letters Patent is hereby corrected as shown below:

<u>Column 24 (cont'd),</u>
Line 30, the words "W2OverVia to" should read -- $W_2OverVia$ to --.
Lines 31, 35 and 38, the words "$W_2$ PFVA" should read -- $W_2PFVA$ --.

<u>Column 27,</u>
Line 20, the words "Moreover. n may" should read -- Moreover, n may --.

<u>Column 28,</u>
Line 18, the words "Diva" should read -- DIVA --.

<u>Column 29,</u>
Line 27, the word "fail" should read -- fall --.
Line 30, the words "In claim 7" should read -- in claim 7 --.

<u>Column 30,</u>
Line 23, the words "wireless of" should read -- wireless or --.
Line 53, the words "In claim 17" should read -- in claim 17 --.

<u>Column 32,</u>
Line 52, the words "$w_i$ PFVA" should read -- $w_0$ PFVA --.
Line 64, the words "$w_i$ CPFVA" should read -- $w_n$ CPFVA --.

This certificate supersedes Certificate of Correction issued May 31, 2005 and August 23, 2005.

Signed and Sealed this

Twenty-fifth Day of October, 2005

JON W. DUDAS
*Director of the United States Patent and Trademark Office*